United States Patent
Gangasani et al.

(10) Patent No.: US 9,685,238 B2
(45) Date of Patent: Jun. 20, 2017

(54) CLOCK SIGNAL GENERATION DEVICE AND MEMORY DEVICE INCLUDING THE SAME

(71) Applicant: SAMSUNG ELECTRONICS CO., LTD., Suwon-si, Gyeonggi-Do (KR)

(72) Inventors: Venkataramana Gangasani, Suwon-si (KR); Sung-Whan Seo, Hwaseong-si (KR); Hi-Choon Lee, Hwaseong-si (KR); Vivek Venkata Kalluru, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/132,525

(22) Filed: Apr. 19, 2016

(65) Prior Publication Data

US 2017/0011806 A1 Jan. 12, 2017

(30) Foreign Application Priority Data

Jul. 9, 2015 (KR) .................. 10-2015-0097572

(51) Int. Cl.
*G11C 5/14* (2006.01)
*G11C 16/30* (2006.01)
*H03K 5/156* (2006.01)
*H03K 5/24* (2006.01)
*H03K 3/037* (2006.01)

(52) U.S. Cl.
CPC .............. *G11C 16/30* (2013.01); *H03K 3/037* (2013.01); *H03K 5/1565* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 6,020,792 A | 2/2000 | Nolan et al. | |
| 7,034,627 B1 | 4/2006 | Kudari | |
| 8,067,992 B2 | 11/2011 | Chen et al. | |
| 8,508,306 B2 | 8/2013 | Choe et al. | |
| 8,665,029 B2 | 3/2014 | Tseng | |
| 8,729,969 B2 | 5/2014 | Huang | |

(Continued)

FOREIGN PATENT DOCUMENTS

| KR | 1104720 B | 1/2012 |
|---|---|---|
| KR | 1167408 B | 7/2012 |

*Primary Examiner* — Kretelia Graham
(74) *Attorney, Agent, or Firm* — Volentine & Whitt, PLLC

(57) ABSTRACT

A clock signal generation device includes a variable voltage providing circuit, a fixed voltage providing circuit and a clock signal generating circuit. The variable voltage providing circuit provides a variable reference voltage based on a selection signal, a reference voltage and a temperature coefficient. The variable reference voltage is varied according to temperature. The fixed voltage providing circuit provides a fixed reference voltage that is determined according to the selection signal. The fixed reference voltage is a constant voltage. The clock signal generating circuit provides a clock signal based on the fixed reference voltage and the variable reference voltage. The performance of the clock signal generation device may be increased by providing the clock signal based on the variable reference voltage that is varied according to the temperature and based on the fixed reference voltage.

20 Claims, 19 Drawing Sheets

(56) References Cited

U.S. PATENT DOCUMENTS

| | | | |
|---|---|---|---|
| 2002/0126565 A1* | 9/2002 | Kawai | G11C 5/145 |
| | | | 365/233.1 |
| 2008/0284532 A1 | 11/2008 | Bakker | |
| 2010/0066433 A1* | 3/2010 | Mochizuki | H03F 1/301 |
| | | | 327/512 |
| 2012/0007581 A1 | 1/2012 | Yoon | |
| 2012/0229221 A1 | 9/2012 | Kim | |

* cited by examiner

CLOCK SIGNAL GENERATION DEVICE AND MEMORY DEVICE INCLUDING THE SAME

CROSS-REFERENCE TO RELATED APPLICATION

A claim of priority under 35 USC §119 is made to Korean Patent Application No. 10-2015-0097572, filed on Jul. 9, 2015 in the Korean Intellectual Property Office (KIPO), the entire contents of which are hereby incorporated by reference.

BACKGROUND

The present inventive concept herein relates generally to a memory device, and more particularly to a clock signal generation device and a memory device including the clock signal device.

As the development of electronic devices has progressed, there has been effort to improve performance and speed of memory devices within the electronic devices. Various efforts have been made to improve performance and speed of memory devices, including research focused on the clock signals used by the memory devices.

SUMMARY

Embodiments of the inventive concept provide a clock signal generation device capable of increasing performance by providing a clock signal based on a variable reference voltage that is varied according to temperature and a fixed reference voltage.

Some embodiments of the inventive concept provide a memory device capable of increasing performance by providing a clock signal based on a variable reference voltage that is varied according to temperature and a fixed reference voltage.

According to some embodiments of the inventive concept, a clock signal generation device includes a variable voltage providing circuit, a fixed voltage providing circuit and a clock signal generating circuit. The variable voltage providing circuit provides a variable reference voltage based on a selection signal, a reference voltage and a temperature coefficient. The variable reference voltage is varied according to temperature. The fixed voltage providing circuit provides a fixed reference voltage that is determined according to the selection signal. The fixed reference voltage is a constant voltage. The clock signal generating circuit provides a clock signal based on the fixed reference voltage and the variable reference voltage.

The variable voltage providing circuit may include a voltage provider and a voltage regulator. The voltage provider may be configured to provide a temperature-variable voltage and a temperature-fixed voltage. The temperature-variable voltage may be varied according to the temperature. The temperature-fixed voltage may be fixed according to the temperature. The voltage regulator may be configured to provide the variable reference voltage based on the temperature-variable voltage, the temperature-fixed voltage, the reference voltage, the temperature coefficient and the selection signal.

The voltage regulator may include a differential difference amplifier and a voltage output circuit. The differential difference amplifier may be configured to provide an amplification output voltage based on the temperature-variable voltage, the temperature-fixed voltage, the reference voltage, the temperature coefficient and a feedback voltage. The voltage output circuit may be configured to provide the variable reference voltage and the feedback voltage based on the amplification output voltage and the selection signal.

The variable voltage providing circuit may further include a selector configured to select the temperature-variable voltage and the temperature-fixed voltage based on the selection signal.

When the selection signal is a first logic level, the selector may be configured to provide the temperature-variable voltage to a second input of the differential difference amplifier and provide the temperature-fixed voltage to a first input of the differential difference amplifier.

When the selection signal is the first logic level, the variable reference voltage may be increased in proportion to variation of the temperature as the temperature is increased.

When the selection signal is the first logic level and the variable reference voltage is increased, a period of the clock signal may be decreased in proportion to variation of the variable reference voltage.

When the selection signal is a second logic level, the selector may be configured to provide the temperature-variable voltage to a first input of the differential difference amplifier and provide the temperature-fixed voltage to a second input of the differential difference amplifier.

When the selection signal is the second logic level, the variable reference voltage may be decreased in proportion to variation of the temperature as the temperature is increased.

When the selection signal is the second logic level and the variable reference voltage is decreased, a period of the clock signal may be increased in proportion to variation of the variable reference voltage.

The reference voltage may be provided to a third input of the differential difference amplifier and the feedback voltage may be provided to a fourth input of the differential difference amplifier.

The reference voltage may be provided from the fixed voltage providing circuit.

The voltage output circuit may include a transistor, a first voltage output resistor and a second voltage output resistor. The transistor may be connected between a variable reference voltage node and a power supply voltage. The variable reference voltage may be output at the variable reference voltage node. The first voltage output resistor may be connected between the variable reference voltage node and a feedback voltage node. The feedback voltage may be output at the feedback voltage node. The second voltage output resistor may be connected between the feedback voltage node and a ground voltage.

The first voltage output resistor may be configured to vary a resistance of the first voltage output resistor based on the selection signal.

The fixed voltage providing circuit may include a resistor circuit in which a first reference resistor, a second reference resistor and a third reference resistor are serially connected between a power supply voltage and a ground voltage.

The fixed reference voltage may include a first fixed reference voltage and a second fixed reference voltage. The first fixed reference voltage may be provided from a first fixed reference voltage node that connects the first reference resistor and the second reference resistor. The second fixed reference voltage may be provided from a second fixed reference voltage node that connects the second reference resistor and the third reference resistor.

When the selection signal is a first logic level, the fixed reference voltage may be the first fixed reference voltage.

When the selection signal is a second logic level, the fixed reference voltage may be the second fixed reference voltage.

The variable reference voltage may be provided to inputs of comparators included in the clock signal generating circuit.

According to some embodiments of the inventive concept, a memory device includes a clock signal generation device and a memory cell array. The clock signal generation device includes a variable voltage providing circuit, a fixed voltage providing circuit and a clock signal generating circuit. The clock signal generation device may be configured to provide a clock signal based on a selection signal, a reference voltage and a temperature coefficient. The memory cell array operates based on the clock signal. The variable voltage providing circuit may be configured to provide a variable reference voltage based on the selection signal, the reference voltage and the temperature coefficient. The variable reference voltage is varied according to temperature. The fixed voltage providing circuit may be configured to provide a fixed reference voltage that is determined according to the selection signal. The fixed reference voltage is a constant voltage. The clock signal generating circuit may be configured to provide the clock signal based on the fixed reference voltage and the variable reference voltage.

The memory cell array may be a three-dimensional memory cell array.

According to some embodiments of the inventive concept, a clock signal generation device includes a variable voltage providing circuit, a fixed voltage providing circuit and a clock signal generating circuit. The variable voltage providing circuit may be configured to provide a variable reference voltage based on a selection signal, the variable reference voltage being varied according to temperature. The fixed providing circuit may be configured to provide a fixed reference voltage that is determined according to the selection signal, the fixed reference voltage being a constant voltage. The clock signal generating circuit may be configured to provide a clock signal based on the fixed reference voltage and the variable reference voltage. The variable voltage providing circuit may be configured to increase the variable reference voltage in proportion to variation of the temperature as the temperature is increased when the selection signal is a first logic level, and to decrease the variable reference voltage in proportion to variation of the temperature as the temperature is increased when the selection signal is a second logic level.

The clock signal generation device may increase performance by providing the clock signal based on the variable reference voltage that is varied according to the temperature and the fixed reference voltage.

BRIEF DESCRIPTION OF THE DRAWINGS

Embodiments of the inventive concept will be more clearly understood from the following detailed description taken in conjunction with the accompanying drawings, wherein.

DETAILED DESCRIPTION OF THE EMBODIMENTS

Figure 1:
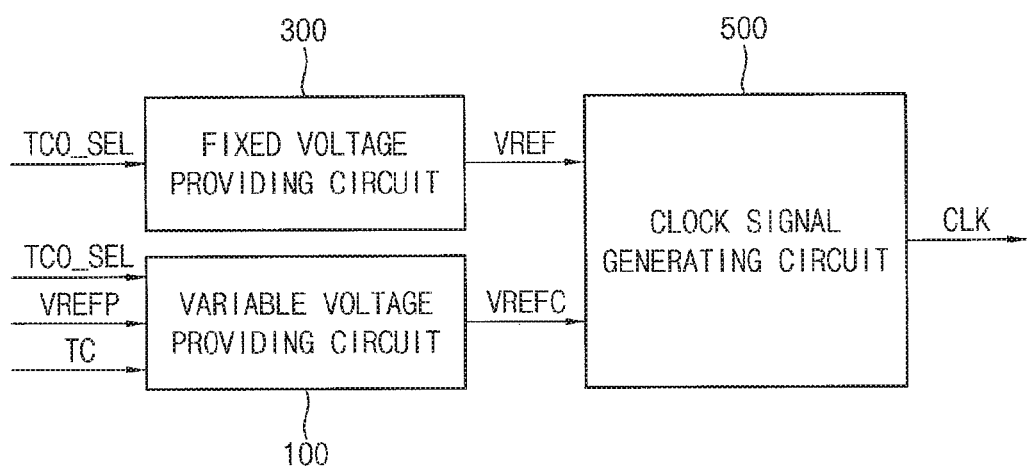
FIG. 1 illustrates a block diagram of a clock signal generation device according to an embodiment of the inventive concept.

Various example embodiments will be described more fully hereinafter with reference to the accompanying drawings, in which some embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It should be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It should be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a clock signal generation device according to an embodiment of the inventive concept.

Referring to FIG. 1, a clock signal generation device 10 includes a variable voltage providing circuit 100, a fixed voltage providing circuit 300 and a clock signal generating circuit 500. The variable voltage providing circuit 100 provides a variable reference voltage VREFC based on a selection signal TCO_SEL, a reference voltage VREFP and a temperature coefficient TC. The variable reference voltage VREFC is varied according to temperature. For example, the selection signal TCO_SEL may be one of a first logic level and a second logic level. The first logic level may be a logic high level and the second logic level may be a logic low level. The variable reference voltage VREFC may be varied based on the selection signal TCO_SEL. For example, when the selection signal TCO_SEL is the first logic level, the variable reference voltage VREFC may be increased as the temperature is increased. In addition, when the selection signal TCO_SEL is the second logic level, the variable reference voltage VREFC may be decreased as the temperature is increased.

The variable reference voltage VREFC may be varied based on the temperature coefficient TC. For example, a first temperature T1 may be less than a second temperature T2. When the temperature coefficient TC is 0, the variable reference voltage VREFC at the first temperature T1 may be equal to the variable reference voltage VREFC at the second temperature T2. As the temperature coefficient TC is increased, a difference between the variable reference voltage VREFC at the first temperature T1 and the variable reference voltage VREFC at the second temperature T2 may be increased.

The fixed voltage providing circuit 300 provides a fixed reference voltage VREF that is determined according to the selection signal TCO_SEL. The fixed reference voltage VREF is a constant voltage. For example, the fixed reference voltage VREF may include a first fixed reference voltage VREF1 and a second fixed reference voltage VREF2. When the selection signal TCO_SEL is the first logic level, the fixed voltage providing circuit 300 may provide the first fixed reference voltage VREF1. When the selection signal TCO_SEL is the second logic level, the fixed voltage providing circuit 300 may provide the second fixed reference voltage VREF2. The fixed reference voltage VREF may not be varied according to the temperature.

The clock signal generating circuit 500 provides a clock signal CLK based on the fixed reference voltage VREF and the variable reference voltage VREFC. As will be described in FIG. 16, the variable reference voltage VREFC may be provided to comparators 531, 532 included in the clock signal generating circuit 500. In this case, the path of providing the variable reference voltage VREFC to the clock signal generating circuit 500 may be separated from the path of providing the fixed reference voltage VREF to the clock signal generating circuit 500. When the path of providing the variable reference voltage VREFC to the clock signal generating circuit 500 is separated from the path of providing the fixed reference voltage VREF to the clock signal generating circuit 500, the variable reference voltage VREFC may be varied in proportion to variation of the temperature. The varying of the variable reference voltage VREFC is carried out by variable voltage providing circuit 100, as will be subsequently described with respect to FIGS. 2, 4 and 7 for example. In addition, when the path of providing the variable reference voltage VREFC to the clock signal generating circuit 500 is separated from the path of providing the fixed reference voltage VREF to the clock signal generating circuit 500, the period of the clock signal CLK may be varied in proportion to variation of the variable reference voltage VREFC. The varying of the period of the clock signal is carried out by clock signal generating circuit 500.

If the clock signal generation device 10 according to embodiments of the inventive concept is used, the linearity between the variation of the temperature and the period of the clock signal CLK may be increased, and a dependency of the period of the clock signal CLK on a power supply voltage VDD may be decreased.

The clock signal generation device 10 may increase performance by separating the path of providing the variable reference voltage VREFC to the clock signal generating circuit 500 from the path of providing the fixed reference voltage VREF to the clock signal generating circuit 500.

Figure 2:
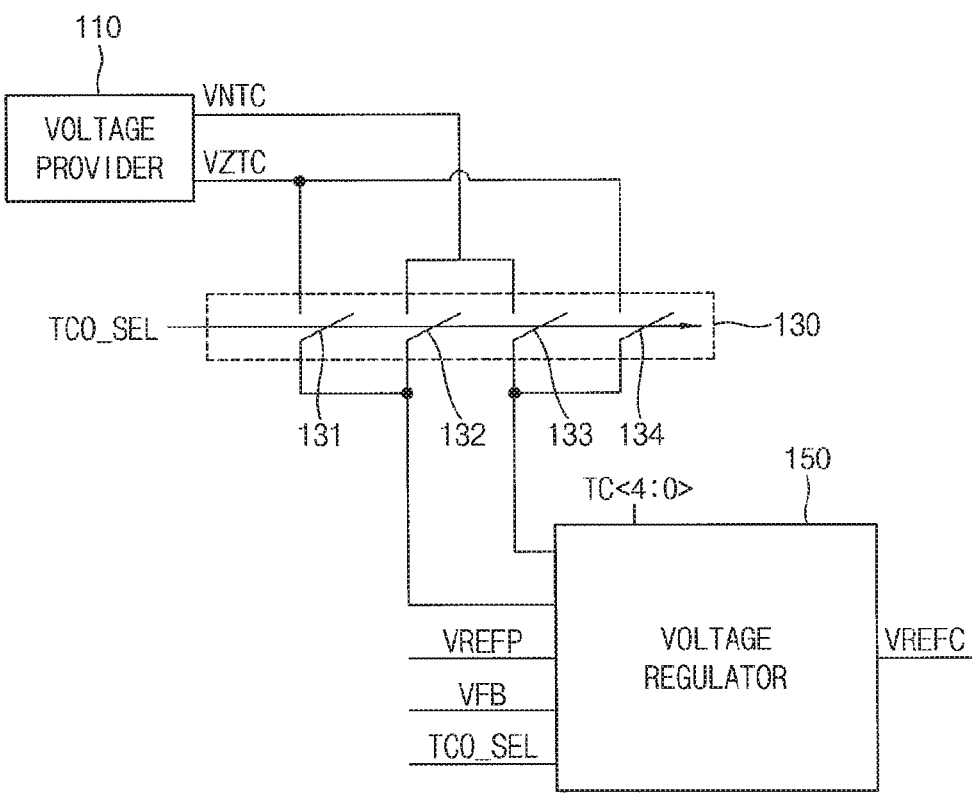
FIG. 2 illustrates a diagram of an example of a variable voltage providing circuit included in the clock signal generation device of FIG. 1.
Figure 3:
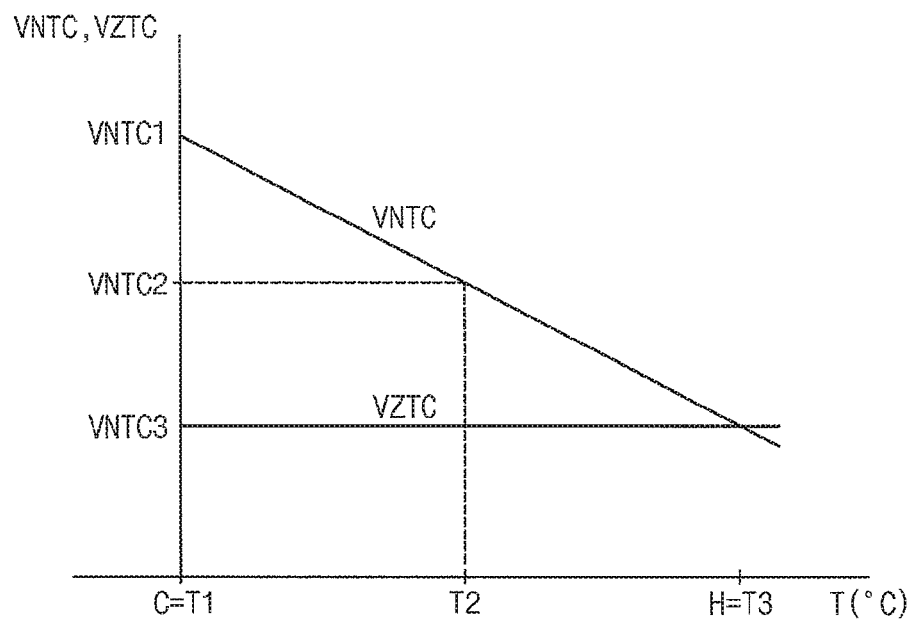
FIG. 3 illustrates a diagram for describing temperature-variable voltage and temperature-fixed voltage that are provided from a voltage provider included in the variable voltage providing circuit of FIG. 2.

FIG. 2 illustrates a diagram of an example of a variable voltage providing circuit 100 included in the clock signal generation device of FIG. 1, and FIG. 3 illustrates a diagram for describing temperature-variable voltage and temperature-fixed voltage that are provided from a voltage provider included in the variable voltage providing circuit of FIG. 2.

Referring to FIGS. 2 and 3, the variable voltage providing circuit 100 includes a voltage provider 110 and a voltage regulator 150. The voltage provider 110 may provide a temperature-variable voltage VNTC and a temperature-fixed voltage VZTC. The temperature-variable voltage VNTC may be varied according to the temperature. The temperature-fixed voltage VZTC may be fixed according to the temperature. For example, the temperature-variable voltage VNTC may be decreased as the temperature is increased. The first temperature T1 may be less than the second temperature T2, and the second temperature T2 may be less than the third temperature T3. The temperature-variable voltage VNTC at the first temperature T1 may be a first temperature-variable voltage VNTC1, the temperature-variable voltage VNTC at the second temperature T2 may be a second temperature-variable voltage VNTC2 and the temperature-variable voltage VNTC at the third temperature T3 may be a third temperature-variable voltage VNTC3. In this case, the first temperature-variable voltage VNTC1 may be greater than the second temperature-variable voltage VNTC2. In addition, the second temperature-variable voltage VNTC2 may be greater than the third temperature-variable voltage VNTC3. Therefore, the temperature-variable voltage VNTC may be decreased as the temperature is increased. The temperature-fixed voltage VZTC may be fixed according to the temperature. For example, the temperature-fixed voltage VZTC may be a constant as the temperature is increased. The first temperature T1 may be less than the second temperature T2, and the second temperature T2 may be less than the third temperature T3. The temperature-fixed voltage VZTC at the first temperature T1 may be a first temperature-fixed voltage VZTC1, the temperature-fixed voltage VZTC at the second temperature T2 may be a second temperature-fixed voltage VZTC2 and the temperature-fixed voltage VZTC at the third temperature T3 may be a third temperature-fixed voltage VZTC3. In this case, the first temperature-fixed voltage VZTC1 may be equal to the second temperature-fixed voltage VZTC2. In addition, the second temperature-fixed voltage VZTC2 may be equal to the third temperature-fixed voltage VZTC3. Therefore, the temperature-fixed voltage VZTC may be a constant as the temperature is increased.

In the present embodiment, the voltage provider 110 may include a bandgap voltage reference circuit, which generates the temperature-fixed voltage VZTC and the temperature-variable voltage VNTC. For example, the temperature-variable voltage VNTC may correspond to a CTAT (Complementary To Absolute Temperature) voltage of the bandgap voltage reference circuit. However, example embodiments are not limited thereto.

In the present embodiment, the variable voltage providing circuit 100 further includes a selector 130 that selects the temperature-variable voltage VNTC and the temperature-fixed voltage VZTC based on the selection signal TCO_SEL. For example, the selector 130 includes the first to fourth selection switches 131 to 134. When the selection signal TCO_SEL is the first logic level, the second selection switch 132 and the fourth selection switch 134 may be turned-on. When the second selection switch 132 is turned-on, the temperature-variable voltage VNTC that is provided from the voltage provider 110 is provided to the voltage regulator 150 through the second selection switch 132. When the fourth selection switch 134 is turned-on, the temperature-fixed voltage VZTC that is provided from the voltage provider 110 is provided to the voltage regulator 150 through the fourth selection switch 134. In addition, when the selection signal TCO_SEL is the first logic level, the first selection switch 131 and the third selection switch 133 may be turned-off. When the first selection switch 131 is turned-off, the temperature-fixed voltage VZTC that is provided from the voltage provider 110 is not provided to the voltage regulator 150 through the first selection switch 131. When the third selection switch 133 is turned-off, the temperature-variable voltage VNTC that is provided from the voltage provider 110 is not provided to the voltage regulator 150 through the third selection switch 133.

In addition, when the selection signal TCO_SEL is the second logic level, the first selection switch 131 and the third selection switch 133 may be turned-on. When the first selection switch 131 is turned-on, the temperature-fixed voltage VZTC that is provided from the voltage provider 110 is provided to the voltage regulator 150 through the first selection switch 131. When the third selection switch 133 is turned-on, the temperature-variable voltage VNTC that is provided from the voltage provider 110 is provided to the voltage regulator 150 through the third selection switch 133. In addition, when the selection signal TCO_SEL is the second logic level, the second selection switch 132 and the fourth selection switch 134 may be turned-off. When the second selection switch 132 is turned-off, the temperature-variable voltage VNTC that is provided from the voltage provider 110 is not provided to the voltage regulator 150 through the second selection switch 132. When the fourth selection switch 134 is turned-off, the temperature-fixed voltage VZTC that is provided from the voltage provider 110 is not provided to the voltage regulator 150 through the fourth selection switch 134.

Figure 4:
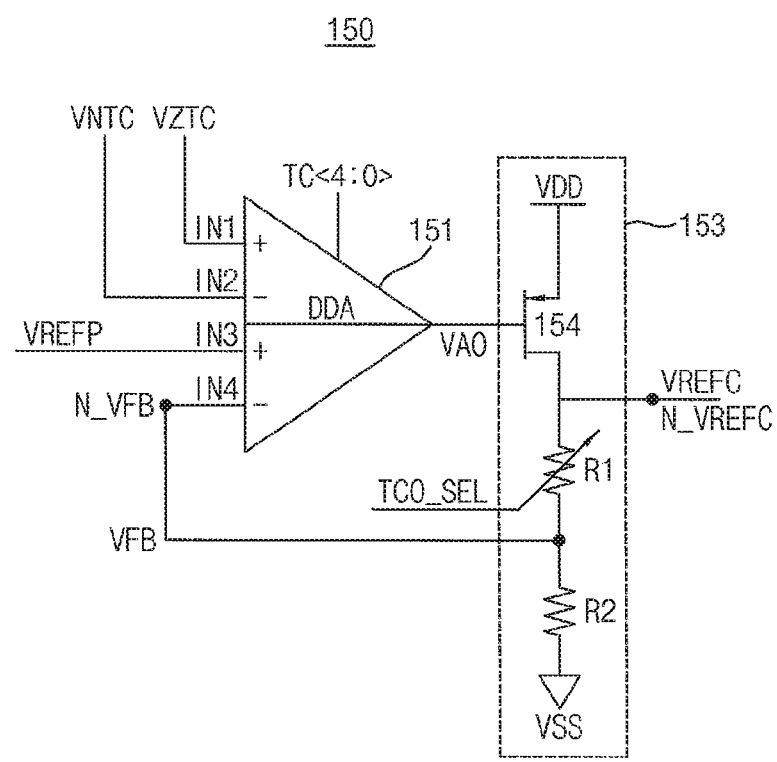
FIG. 4 illustrates a circuit diagram of an example of a voltage regulator included in the variable voltage providing circuit of FIG. 2 when a selection signal is the first logic level.

FIG. 4 illustrates a circuit diagram of an example of a voltage regulator included in the variable voltage providing circuit of FIG. 2 when a selection signal is the first logic level.

Referring to FIG. 4, the voltage regulator 150 may provide the variable reference voltage VREFC based on the temperature-variable voltage VNTC, the temperature-fixed voltage VZTC, the reference voltage VREFP, the temperature coefficient TC and the selection signal TCO_SEL. The voltage regulator 150 includes a differential difference amplifier 151 and a voltage output circuit 153. The differential difference amplifier 151 may provide an amplification output voltage VAO based on the temperature-variable voltage VNTC, the temperature-fixed voltage VZTC, the reference voltage VREFP, the temperature coefficient TC and a feedback voltage VFB. The voltage output circuit 153 may provide the variable reference voltage VREFC and the feedback voltage VFB based on the amplification output voltage VAO and the selection signal TCO_SEL. The voltage output circuit 153 includes a transistor 154, a first voltage output resistor R1 and a second voltage output resistor R2. The transistor 154 is connected between a variable reference voltage node N_VREFC and a power supply voltage VDD. The variable reference voltage node N_VREFC may provide the variable reference voltage VREFC. The first voltage output resistor R1 is connected between the variable reference voltage node N_VREFC and a feedback voltage node N_VFB. The feedback voltage node N_VFB may provide the feedback voltage VFB. The second voltage output resistor R2 is connected between the feedback voltage node N_VFB and a ground voltage VSS. In an example embodiment, a resistance of the first voltage output resistor R1 may be varied based on the selection signal TCO_SEL. As will be described with respect to FIG. 11, the fixed reference voltage VREF may include the first fixed reference voltage VREF1 and the second fixed reference voltage VREF2. For example, when the first fixed reference voltage VREF1 is provided as the fixed reference voltage VREF, the voltage output circuit 153 may control the resistance of the first voltage output resistor R1 based on the selection signal TCO_SEL so that the variable reference voltage VREFC corresponding to the first fixed reference voltage VREF1 is provided. In addition, when the second fixed reference voltage VREF2 is provided as the fixed reference voltage VREF, the voltage output circuit 153 may control the resistance of the first voltage output resistor R1 based on the selection signal TCO_SEL so that the variable reference voltage VREFC corresponding to the second fixed reference voltage VREF2 is provided.

In an example embodiment, when the selection signal TCO_SEL is a first logic level, the selector 130 may provide the temperature-variable voltage VNTC to a second input IN2 of the differential difference amplifier 151 and provide the temperature-fixed voltage VZTC to a first input IN1 of the differential difference amplifier 151. For example, the selector 130 may include the first to fourth selection switches 131 to 134. When the selection signal TCO_SEL is the first logic level, the second selection switch 132 and the fourth selection switch 134 may be turned-on. When the second selection switch 132 is turned-on, the temperature-variable voltage VNTC that is provided from the voltage provider 110 is provided to the second input IN2 of the differential difference amplifier 151 through the second selection switch 132. When the fourth selection switch 134 is turned-on, the temperature-fixed voltage VZTC that is provided from the voltage provider 110 is provided to the first input IN1 of the differential difference amplifier 151 through the fourth selection switch 134. In addition, when the selection signal TCO_SEL is the first logic level, the first selection switch 131 and the third selection switch 133 may be turned-off. When the first selection switch 131 is turned-off, the temperature-fixed voltage VZTC that is provided from the voltage provider 110 is not provided to the second input IN2 of the differential difference amplifier 151 through the first selection switch 131. When the third selection switch 133 is turned-off, the temperature-variable voltage VNTC that is provided from the voltage provider 110 is not provided to the first input IN1 of the differential difference amplifier 151 through the third selection switch 133.

In the clock signal generation device 10, the path of providing the variable reference voltage VREFC to the clock signal generating circuit 500 may be separated from the path of providing the fixed reference voltage VREF to the clock signal generating circuit 500. When the path of providing the variable reference voltage VREFC to the clock signal generating circuit 500 is separated from the path of providing the fixed reference voltage VREF to the clock signal generating circuit 500, the variable reference voltage VREFC may be varied in proportion to variation of the temperature. In addition, when the path of providing the variable reference voltage VREFC to the clock signal generating circuit 500 is separated from the path of providing the fixed reference voltage VREF to the clock signal generating circuit 500, the period of the clock signal CLK may be varied in proportion to variation of the variable reference voltage VREFC. If the clock signal generation device 10 according to example embodiments is used, the linearity between the variation of the temperature and the period of the clock signal CLK may be increased, and a dependency of the period of the clock signal CLK on a power supply voltage VDD may be decreased.

The clock signal generation device 10 may increase performance by separating the path of providing the variable reference voltage VREFC to the clock signal generating circuit 500 from the path of providing the fixed reference voltage VREF to the clock signal generating circuit 500.

Figure 5:
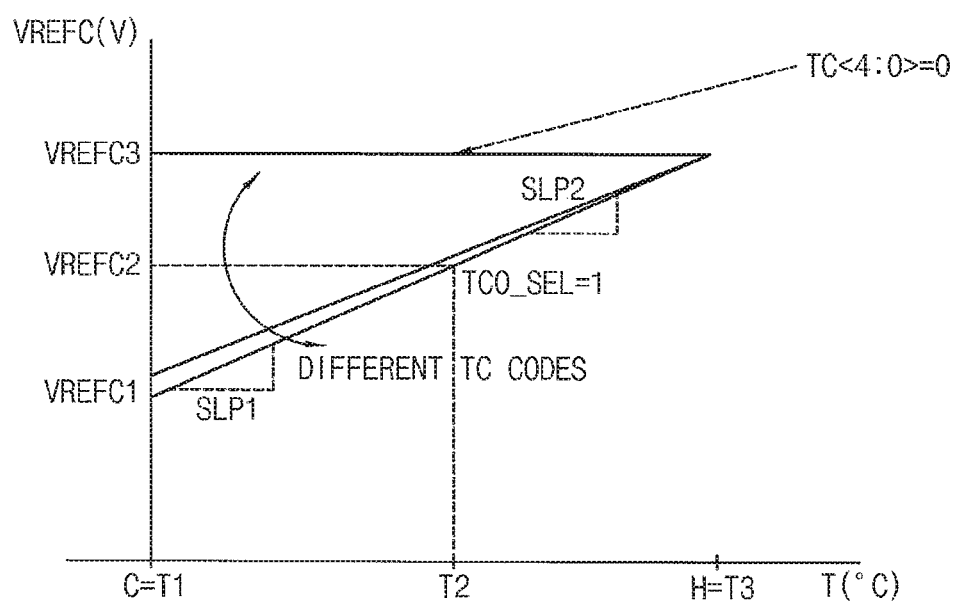
FIG. 5 illustrates a diagram of a variable reference voltage that is varied according to temperature when a selection signal is the first logic level.

FIG. 5 illustrates a diagram of a variable reference voltage that is varied according to temperature when a selection signal is the first logic level. In FIG. 5, the first logic level is illustrated as "1".

Referring to FIGS. 3 and 5, when the selection signal TCO_SEL is the first logic level, the variable reference voltage VREFC may be increased in proportion to variation of the temperature as the temperature is increased. The variable reference voltage VREFC may be represented by Equation 1 as follows, and wherein k is given by Equation 2 as further follows.

$$V_{refC} = \left(1 + \frac{R_{1a}}{R_2}\right)(V_{refp} + k(V_{NTC} - V_{ZTC})) = V_{ref1} + k\left(1 + \frac{R_{1a}}{R_2}\right)(V_{NTC} - V_{ZTC}) \quad \text{[Equation 1]}$$

$$k = -\left\lfloor \frac{T<4>2^4 + T<3>2^3 + T<2>2^2 + T<1>2^1 + T<0>2^0}{2^5} \right\rfloor \quad \text{[Equation 2]}$$

Where Vrefc is the variable reference voltage VREFC, R1a is the first voltage output resistor R1 when the selection signal TCO_SEL is the first logic level, R2 is the second voltage output resistor R2, Vrefp is the reference voltage VREFP, T is the temperature coefficient TC, K is a variable value according to the temperature coefficient TC, VNTC is the temperature-variable voltage VNTC and VZTC is the temperature-fixed voltage VZTC.

For example, the first temperature T1 may be less than the second temperature T2 and the second temperature T2 may be less than the third temperature T3. The temperature-variable voltage VNTC at the first temperature T1 may be a first temperature-variable voltage VNTC1, the temperature-variable voltage VNTC at the second temperature T2 may be a second temperature-variable voltage VNTC2 and the temperature-variable voltage VNTC at the third temperature T3 may be a third temperature-variable voltage VNTC3. In this case, the first temperature-variable voltage VNTC1 may be greater than the second temperature-variable voltage VNTC2. In addition, the second temperature-variable voltage VNTC2 may be greater than the third temperature-variable voltage VNTC3. The temperature-fixed voltage VZTC at the first temperature T1 may be a first temperature-fixed voltage VZTC1, the temperature-fixed voltage VZTC at the second temperature T2 may be a second temperature-fixed voltage VZTC2 and the temperature-fixed voltage VZTC at the third temperature T3 may be a third temperature-fixed voltage VZTC3. In this case, the first temperature-fixed voltage VZTC1 may be equal to the third temperature-variable voltage VNTC3. In addition, the second temperature-fixed voltage VZTC2 may be equal to the third temperature-variable voltage VNTC3. The third temperature-fixed voltage VZTC3 may be equal to the third temperature-variable voltage VNTC3.

Therefore, a difference between the temperature-variable voltage VNTC and the temperature-fixed voltage VZTC at the first temperature T1 may be greater than a difference between the temperature-variable voltage VNTC and the temperature-fixed voltage VZTC at the second temperature T2. In addition, a difference between the temperature-variable voltage VNTC and the temperature-fixed voltage VZTC at the second temperature T2 may be greater than a difference between the temperature-variable voltage VNTC and the temperature-fixed voltage VZTC at the third temperature T3.

In this case, since K is a negative value, when the selection signal TCO_SEL is the first logic level, the variable reference voltage VREFC may be increased in proportion to variation of the temperature as the temperature is increased. For example, the first temperature T1 may be less than the second temperature T2 and the second temperature T2 may be less than the third temperature T3. The variable reference voltage VREFC at the first temperature T1 may be a first variable reference voltage VREFC1, the variable reference voltage VREFC at the second temperature T2 may be a second variable reference voltage VREFC2 and the variable reference voltage VREFC at the third temperature T3 may be a third variable reference voltage VREFC3. In this case, the value of dividing the difference between the first variable reference voltage VREFC1 and the second variable reference voltage VREFC2 with the difference between the first temperature T1 and the second temperature T2 may be equal to the value of dividing the difference between the second variable reference voltage VREFC2 and the third variable reference voltage VREFC3 with the difference between the second temperature T2 and the third temperature T3. The value of dividing the difference between the first variable reference voltage VREFC1 and the second variable reference voltage VREFC2 with the difference between the first temperature T1 and the second temperature T2 may be a first slope SLP1. The value of dividing the difference between the second variable reference voltage VREFC2 and the third variable reference voltage VREFC3 with the difference between the second temperature T2 and the third temperature T3 may be a second slope SLP2. In this case, the first slope SLP1 may be equal to the second slope SLP2. Therefore, when the selection signal TCO_SEL is the first logic level, the variable reference voltage VREFC may be linearly increased in proportion to variation of the temperature as the temperature is increased.

The slope may be varied as the temperature coefficient TC is varied. For example, when the temperature coefficient TC is 0, the slope may be 0. In this case, the variable reference voltage VREFC at the first temperature T1 may be equal to the third variable reference voltage VREFC3. In addition, the variable reference voltage VREFC at the second temperature T2 may be equal to the third variable reference voltage VREFC3. In addition, the variable reference voltage VREFC at the third temperature T3 may be equal to the third variable reference voltage VREFC3.

Figure 6:
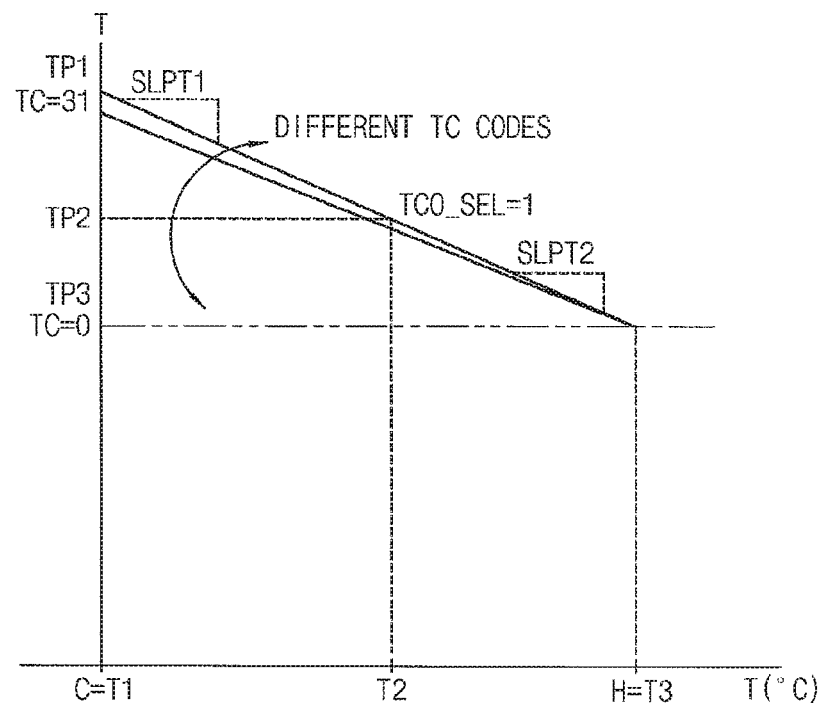
FIG. 6 illustrates a diagram of a clock period according to temperature when a selection signal is the first logic level.

FIG. 6 illustrates a diagram of a clock period according to temperature when a selection signal is the first logic level. In FIG. 6, the first logic level is illustrated as "1".

Referring to FIG. 6, when the selection signal TCO_SEL is the first logic level and the variable reference voltage VREFC is increased, a period of the clock signal CLK may be decreased in proportion to variation of the variable reference voltage VREFC. The period of the clock signal CLK may be represented by Equation 3 as follows.

$$T = 2RC\frac{(V_{DD} - V_{refC})}{(V_{DD} - V_{ref1})}$$ [Equation 3]

Where T is the period of the clock signal CLK, 2RC is a constant, VDD is a power supply voltage VDD, Vrefc is the variable reference voltage VREFC and Vref1 is the fixed reference voltage VREF.

For example, when the selection signal TCO_SEL is the first logic level, the variable reference voltage VREFC may be increased in proportion to variation of the temperature as the temperature is increased. When the selection signal TCO_SEL is the first logic level and the variable reference voltage VREFC is increased in proportion to variation of the temperature, a period of the clock signal CLK may be decreased in proportion to variation of the variable reference voltage VREFC. For example, the first temperature T1 may be less than the second temperature T2 and the second temperature T2 may be less than the third temperature T3. The period of the clock signal CLK at the first temperature T1 may be a first clock period TP1, the period of the clock signal CLK at the second temperature T2 may be a second clock period TP2 and the period of the clock signal CLK at the third temperature T3 may be a third clock period TP3. In this case, the value of dividing the difference between the first clock period TP1 and the second clock period TP2 with the difference between the first temperature T1 and the second temperature T2 may be equal to the value of dividing the difference between the second clock period TP2 and the third clock period TP3 with the difference between the second temperature T2 and the third temperature T3. The value of dividing the difference between the first clock period TP1 and the second clock period TP2 with the difference between the first temperature T1 and the second temperature T2 may be a first period slope SLPT1. The value of dividing the difference between the second clock period TP2 and the third clock period TP3 with the difference between the second temperature T2 and the third temperature T3 may be a second period slope SLPT2. In this case, the first period slope SLPT1 may be equal to the second period slope SLPT2. Therefore, when the selection signal TCO_SEL is the first logic level and the variable reference voltage VREFC is increased, a period of the clock signal CLK may be linearly decreased in proportion to variation of the variable reference voltage VREFC.

The period slope may be varied as the temperature coefficient TC is varied. For example, when the temperature coefficient TC is 0, the period slope may be 0. In this case, the period of the clock signal CLK at the first temperature T1 may be equal to the third clock period TP3. In addition, the period of the clock signal CLK at the second temperature T2 may be equal to the third clock period TP3. In addition, the period of the clock signal CLK at the third temperature T3 may be equal to the third clock period TP3.

Figure 7:
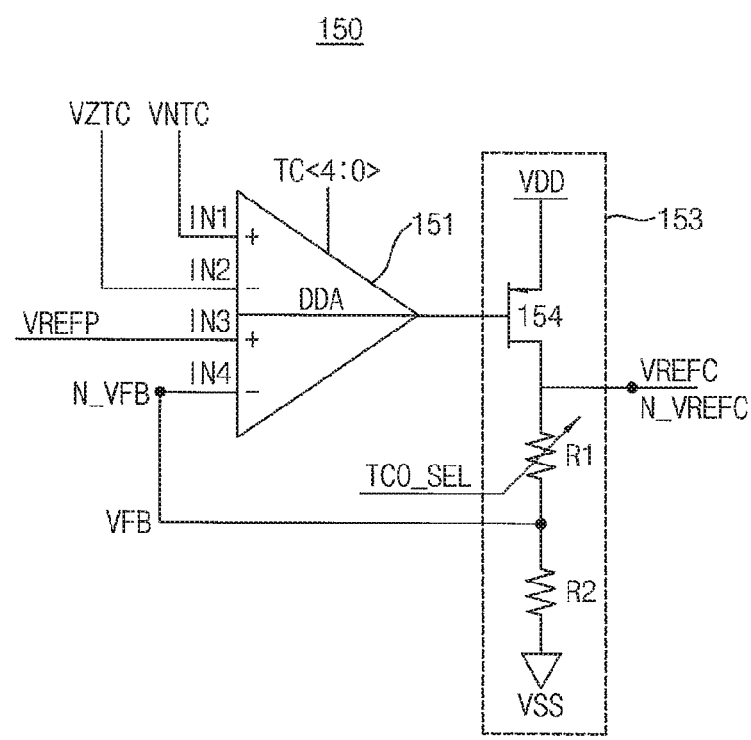
FIG. 7 illustrates a circuit diagram of an example of a voltage regulator included in the variable voltage providing circuit of FIG. 2 when a selection signal is the second logic level.

FIG. 7 illustrates a circuit diagram of an example of a voltage regulator included in the variable voltage providing circuit of FIG. 2, when a selection signal is the second logic level.

Referring to FIG. 7, the voltage regulator 150 may provide the variable reference voltage VREFC based on the temperature-variable voltage VNTC, the temperature-fixed voltage VZTC, the reference voltage VREFP, the temperature coefficient TC and the selection signal TCO_SEL. The voltage regulator 150 may include a differential difference amplifier 151 and a voltage output circuit 153. The differential difference amplifier 151 may provide an amplification output voltage VAO based on the temperature-variable voltage VNTC, the temperature-fixed voltage VZTC, the reference voltage VREFP, the temperature coefficient TC and a feedback voltage VFB. The voltage output circuit 153 may provide the variable reference voltage VREFC and the feedback voltage VFB based on the amplification output voltage VAO and the selection signal TCO_SEL. The voltage output circuit 153 includes a transistor 154, a first voltage output resistor R1 and a second voltage output resistor R2. The transistor 154 is connected between a variable reference voltage node N_VREFC and a power supply voltage VDD. The variable reference voltage node N_VREFC may provide the variable reference voltage VREFC. The first voltage output resistor R1 is connected between the variable reference voltage node N_VREFC and a feedback voltage node N_VFB. The feedback voltage node N_VFB may provide the feedback voltage VFB. The second voltage output resistor R2 is connected between the feedback voltage node N_VFB and a ground voltage VSS. In an example embodiment, a resistance of the first voltage output resistor R1 may be varied based on the selection signal TCO_SEL. As will be described with respect to FIG. 11, the fixed reference voltage VREF may include the first fixed reference voltage VREF1 and the second fixed reference voltage VREF2. For example, when the first fixed reference voltage VREF1 is provided as the fixed reference voltage VREF, the voltage output circuit 153 may control the resistance of the first voltage output resistor R1 based on the selection signal TCO_SEL so that the variable reference voltage VREFC corresponding to the first fixed reference voltage VREF1 is provided. In addition, when the second fixed reference voltage VREF2 is provided as the fixed reference voltage VREF, the voltage output circuit 153 may control the resistance of the first voltage output resistor R1 based on the selection signal TCO_SEL so that the variable reference voltage VREFC corresponding to the second fixed reference voltage VREF2 is provided.

In an example embodiment, when the selection signal TCO_SEL is a second logic level, the selector 130 may provide the temperature-variable voltage VNTC to a first input IN1 of the differential difference amplifier 151 and provide the temperature-fixed voltage VZTC to a second input IN2 of the differential difference amplifier 151. For example, the selector 130 may include the first to fourth selection switches 131 to 134. When the selection signal TCO_SEL is the second logic level, the first selection switch 131 and the third selection switch 133 may be turned-on. When the first selection switch 131 is turned-on, the temperature-fixed voltage VZTC that is provided from the voltage provider 110 is provided to the second input IN2 of the differential difference amplifier 151 through the first selection switch 131. When the third selection switch 133 is turned-on, the temperature-variable voltage VNTC that is provided from the voltage provider 110 is provided to the first input IN1 of the differential difference amplifier 151 through the third selection switch 133. In addition, when the selection signal TCO_SEL is the second logic level, the second selection switch 132 and the fourth selection switch 134 may be turned-off. When the second selection switch 132 is turned-off, the temperature-variable voltage VNTC that is provided from the voltage provider 110 is not provided to the second input IN2 of the differential difference amplifier 151 through the second selection switch 132. When the fourth selection switch 134 is turned-off, the temperature-fixed voltage VZTC that is provided from the voltage provider 110 is not provided to the first input IN1 of the differential difference amplifier 151 through the fourth selection switch 134.

Figure 8:
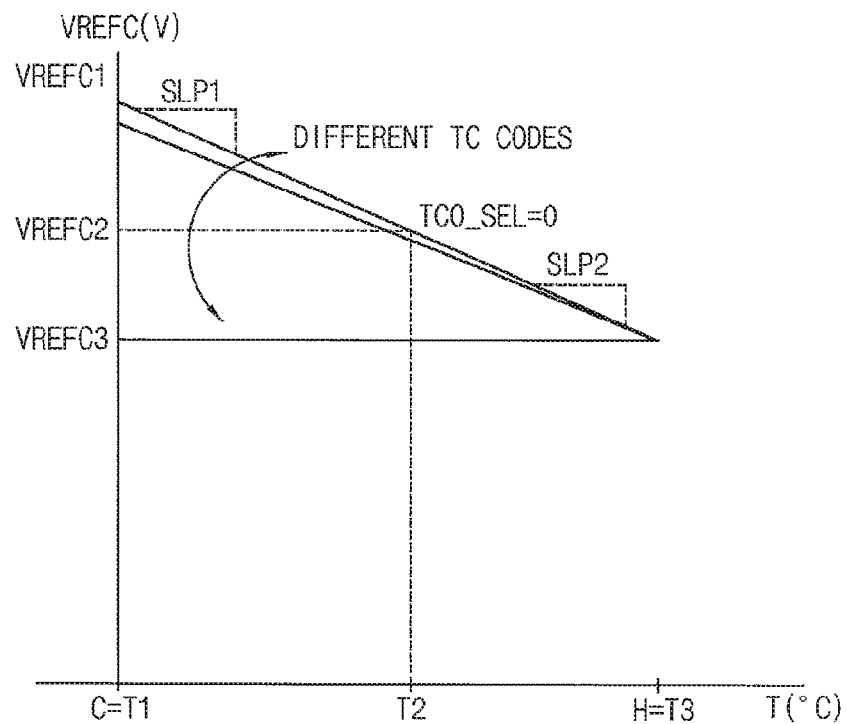
FIG. 8 illustrates a diagram of a variable reference voltage that is varied according to temperature when a selection signal is the second logic level.

FIG. 8 illustrates a diagram of a variable reference voltage that is varied according to temperature when a selection signal is the second logic level. In FIG. 8, the second logic level is illustrated as "0".

Referring to FIGS. 3 and 8, when the selection signal TCO_SEL is the second logic level, the variable reference voltage VREFC may be decreased in proportion to variation of the temperature as the temperature is increased. For example, the first temperature T1 may be less than the second temperature T2 and the second temperature T2 may be less than the third temperature T3. The temperature-variable voltage VNTC at the first temperature T1 may be a first temperature-variable voltage VNTC1, the temperature-variable voltage VNTC at the second temperature T2 may be a second temperature-variable voltage VNTC2 and the temperature-variable voltage VNTC at the third temperature T3 may be a third temperature-variable voltage VNTC3. In this case, the first temperature-variable voltage VNTC1 may be greater than the second temperature-variable voltage VNTC2. In addition, the second temperature-variable voltage VNTC2 may be greater than the third temperature-variable voltage VNTC3. The temperature-fixed voltage VZTC at the first temperature T1 may be a first temperature-fixed voltage VZTC1, the temperature-fixed voltage VZTC at the second temperature T2 may be a second temperature-fixed voltage VZTC2 and the temperature-fixed voltage VZTC at the third temperature T3 may be a third temperature-fixed voltage VZTC3. In this case, the first temperature-fixed voltage VZTC1 may be equal to the third temperature-variable voltage VNTC3. In addition, the second temperature-fixed voltage VZTC2 may be equal to the third temperature-variable voltage VNTC3. The third temperature-fixed voltage VZTC3 may be equal to the third temperature-variable voltage VNTC3.

Therefore, a difference between the temperature-variable voltage VNTC and the temperature-fixed voltage VZTC at the first temperature T1 may be greater than a difference between the temperature-variable voltage VNTC and the temperature-fixed voltage VZTC at the second temperature T2. In addition, a difference between the temperature-variable voltage VNTC and the temperature-fixed voltage VZTC at the second temperature T2 may be greater than a difference between the temperature-variable voltage VNTC and the temperature-fixed voltage VZTC at the third temperature T3.

In this case, since K is a positive value, when the selection signal TCO_SEL is the second logic level, the variable reference voltage VREFC may be decreased in proportion to variation of the temperature as the temperature is increased. For example, the first temperature T1 may be less than the second temperature T2 and the second temperature T2 may be less than the third temperature T3. The variable reference voltage VREFC at the first temperature T1 may be a first variable reference voltage VREFC1, the variable reference voltage VREFC at the second temperature T2 may be a second variable reference voltage VREFC2 and the variable reference voltage VREFC at the third temperature T3 may be a third variable reference voltage VREFC3. In this case, the value of dividing the difference between the first variable reference voltage VREFC1 and the second variable reference voltage VREFC2 with the difference between the first temperature T1 and the second temperature T2 may be equal to the value of dividing the difference between the second variable reference voltage VREFC2 and the third variable reference voltage VREFC3 with the difference between the second temperature T2 and the third temperature T3. The value of dividing the difference between the first variable reference voltage VREFC1 and the second variable reference voltage VREFC2 with the difference between the first temperature T1 and the second temperature T2 may be a first slope SLP1. The value of dividing the difference between the second variable reference voltage VREFC2 and the third variable reference voltage VREFC3 with the difference between the second temperature T2 and the third temperature T3 may be a second slope SLP2. In this case, the first slope SLP1 may be equal to the second slope SLP2. Therefore, when the selection signal TCO_SEL is the second logic level, the variable reference voltage VREFC may be linearly decreased in proportion to variation of the temperature as the temperature is increased.

The slope may be varied as the temperature coefficient TC is varied. For example, when the temperature coefficient TC is 0, the slope may be 0. In this case, the variable reference voltage VREFC at the first temperature T1 may be equal to the third variable reference voltage VREFC3. In addition, the variable reference voltage VREFC at the second temperature T2 may be equal to the third variable reference voltage VREFC3. In addition, the variable reference voltage VREFC at the third temperature T3 may be equal to the third variable reference voltage VREFC3.

In the clock signal generation device 10, the path of providing the variable reference voltage VREFC to the clock signal generating circuit 500 may be separated from the path of providing the fixed reference voltage VREF to the clock signal generating circuit 500. When the path of providing the variable reference voltage VREFC to the clock signal generating circuit 500 is separated from the path of providing the fixed reference voltage VREF to the clock signal generating circuit 500, the variable reference voltage VREFC may be varied in proportion to variation of the temperature. In addition, when the path of providing the variable reference voltage VREFC to the clock signal generating circuit 500 is separated from the path of providing the fixed reference voltage VREF to the clock signal generating circuit 500, the period of the clock signal CLK may be varied in proportion to variation of the variable reference voltage VREFC. If the clock signal generation device 10 according to example embodiments is used, the linearity between the variation of the temperature and the period of the clock signal CLK may be increased, and a dependency of the period of the clock signal CLK on a power supply voltage VDD may be decreased.

The clock signal generation device 10 may increase performance by separating the path of providing the variable reference voltage VREFC to the clock signal generating circuit 500 from the path of providing the fixed reference voltage VREF to the clock signal generating circuit 500.

Figure 9:
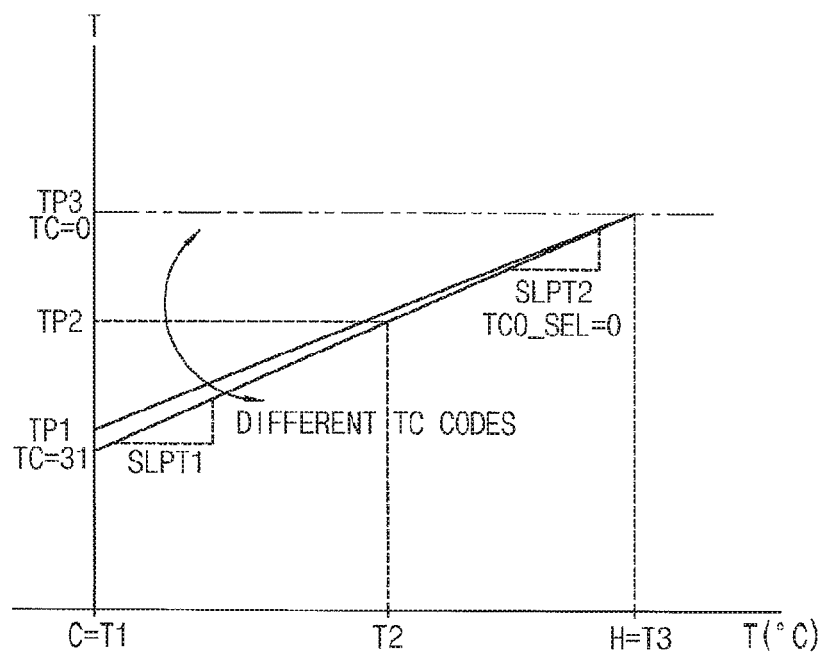
FIG. 9 illustrates a diagram of clock signal period according to temperature when a selection signal is the second logic level.

FIG. 9 illustrates a diagram of clock signal period according to temperature when a selection signal is the second logic level. In FIG. 9, the second logic level is illustrated as "0".

Referring to FIG. 9, when the selection signal TCO_SEL is the second logic level and the variable reference voltage VREFC is decreased, a period of the clock signal CLK may be increased in proportion to variation of the variable reference voltage VREFC.

For example, when the selection signal TCO_SEL is the second logic level, the variable reference voltage VREFC may be decreased in proportion to variation of the temperature as the temperature is increased. When the selection signal TCO_SEL is the second logic level and the variable reference voltage VREFC is decreased, a period of the clock signal CLK may be increased in proportion to variation of the variable reference voltage VREFC. For example, the first temperature T1 may be less than the second temperature T2 and the second temperature T2 may be less than the third temperature T3. The period of the clock signal CLK at the first temperature T1 may be a first clock period TP1, the period of the clock signal CLK at the second temperature T2 may be a second clock period TP2 and the period of the clock signal CLK at the third temperature T3 may be a third clock period TP3. In this case, the value of dividing the difference between the first clock period TP1 and the second clock period TP2 with the difference between the first temperature T1 and the second temperature T2 may be equal to the value of dividing the difference between the second clock period TP2 and the third clock period TP3 with the difference between the second temperature T2 and the third temperature T3. The value of dividing the difference between the first clock period TP1 and the second clock period TP2 with the difference between the first temperature T1 and the second temperature T2 may be a first period slope SLPT1. The value of dividing the difference between the second clock period TP2 and the third clock period TP3 with the difference between the second temperature T2 and the third temperature T3 may be a second period slope SLPT2. In this case, the first period slope SLPT1 may be equal to the second period slope SLPT2. Therefore, when the selection signal TCO_SEL is the second logic level and the variable reference voltage VREFC is decreased, a period of the clock signal CLK may be linearly increased in proportion to variation of the variable reference voltage VREFC.

The period slope may be varied as the temperature coefficient TC is varied. For example, when the temperature coefficient TC is 0, the period slope may be 0. In this case, the period of the clock signal CLK at first temperature T1 may be equal to the third clock period TP3. In addition, the period of the clock signal CLK at second temperature T2 may be equal to the third clock period TP3. In addition, the period of the clock signal CLK at third temperature T3 may be equal to the third clock period TP3.

In an example embodiment, the reference voltage VREFP may be provided to a third input IN3 of the differential difference amplifier 151 and the feedback voltage VFB may be provided to a fourth input IN4 of the differential difference amplifier 151.

Figure 10:
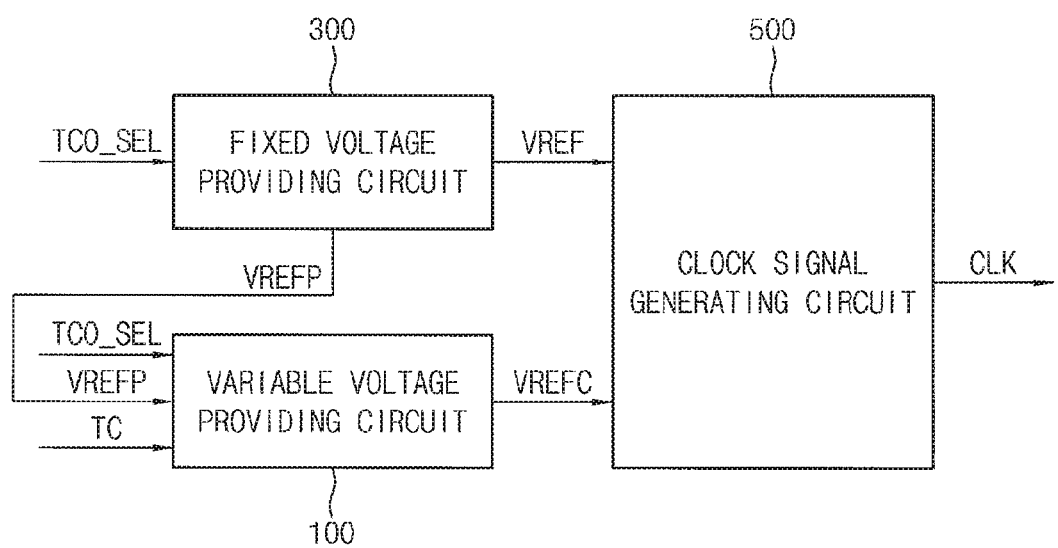
FIG. 10 illustrates a block diagram of a clock signal generation device according to another embodiment of the inventive concept.
Figure 11:
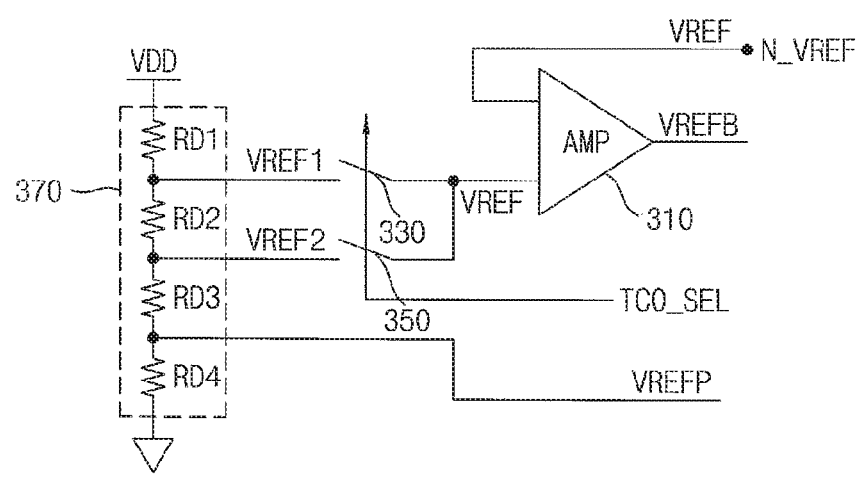
FIG. 11 illustrates a diagram of an example of a fixed voltage providing circuit included in the clock signal generation device of FIG. 10.

FIG. 10 illustrates a block diagram of a clock signal generation device according to another embodiment of the inventive concept, and FIG. 11 illustrates a diagram of an example of a fixed voltage providing circuit included in the clock signal generation device of FIG. 1.

Referring to FIGS. 10 and 11, a clock signal generation device 10 includes a variable voltage providing circuit 100, a fixed voltage providing circuit 300 and a clock signal generating circuit 500. The variable voltage providing circuit 100 provides a variable reference voltage VREFC based on a selection signal TCO_SEL, a reference voltage VREFP and a temperature coefficient TC. The variable reference voltage VREFC is varied according to temperature. The fixed voltage providing circuit 300 provides a fixed reference voltage VREF that is determined according to the selection signal TCO_SEL. The fixed reference voltage VREF is a constant voltage. The clock signal generating circuit 500 provides a clock signal CLK based on the fixed reference voltage VREF and the variable reference voltage VREFC.

In the present embodiment, the fixed voltage providing circuit 300 includes an amplifier AMP 310 and a resistor circuit 370. The resistor circuit 370 includes a first reference resistor RD1, a second reference resistor RD2, a third reference resistor RD3 and a fourth reference resistor RD4. The first reference resistor RD1, the second reference resistor RD2, the third reference resistor RD3 and the fourth reference resistor RD4 are serially connected between the power supply voltage VDD and the ground voltage VSS. The fixed voltage providing circuit 300 further includes a first reference switch 330 and a second reference switch 350. For example, when the selection signal TCO_SEL is the first logic level, the first reference switch 330 may be turned-on and the second reference switch 350 may be turned-off. When the first reference switch 330 is turned-on and the second reference switch 350 is turned-off, the first fixed reference voltage VREF1 is provided as the fixed reference voltage VREF through the first reference switch 330. When the first fixed reference voltage VREF1 is provided as the fixed reference voltage VREF through the first reference switch 330, the first fixed reference voltage VREF1 is provided to the input of the amplifier 310. When the first fixed reference voltage VREF1 is provided to the input of the amplifier 310, as will be described later with reference to FIG. 16, the fixed voltage providing circuit 300 may provide the first fixed reference voltage VREF1 to the clock signal generating circuit 500 through a fixed reference voltage node N_VREF as the fixed reference voltage VREF since voltages of two inputs of the amplifier 310 are substantially the same. In addition, when the selection signal TCO_SEL is the second logic level, the first reference switch 330 may be turned-off and the second reference switch 350 may be turned-on. When the first reference switch 330 is turned-off and the second reference switch 350 is turned-on, the second fixed reference voltage VREF2 is provided as the fixed reference voltage VREF through the second reference switch 350. When the second fixed reference voltage VREF2 is provided as the fixed reference voltage VREF through the second reference switch 350, the second fixed reference voltage VREF2 is provided to the input of the amplifier 310. When the second fixed reference voltage VREF2 is provided to the input of the amplifier 310, as will be described later with reference to FIG. 16, the fixed voltage providing circuit 300 may provide the second fixed reference voltage VREF2 to the clock signal generating circuit 500 through the fixed reference voltage node N_VREF as the fixed reference voltage VREF since voltages of two inputs of the amplifier 310 are substantially the same. The amplifier output voltage VREFB may be provided to the clock signal generating circuit 500.

In an example embodiment, the reference voltage VREFP may be provided from the fixed voltage providing circuit 300. For example, the resistor circuit 370 includes the first reference resistor RD1, the second reference resistor RD2, the third reference resistor RD3 and the fourth reference resistor RD4. The reference voltage VREFP may be a voltage of a node connecting the third reference resistor RD3 and the fourth reference resistor RD4.

In an example embodiment, the fixed reference voltage VREF may include the first fixed reference voltage VREF1 and the second fixed reference voltage VREF2. The first fixed reference voltage VREF1 may be provided from the node connecting the first reference resistor RD1 and the second reference resistor RD2. The second fixed reference voltage VREF2 may be provided from the node connecting the second reference resistor RD2 and the third reference resistor RD3. For example, when the selection signal TCO_SEL is the first logic level, the fixed reference voltage VREF may be the first fixed reference voltage VREF1. When the selection signal TCO_SEL is the second logic level, the fixed reference voltage VREF may be the second fixed reference voltage VREF2.

Figure 12:
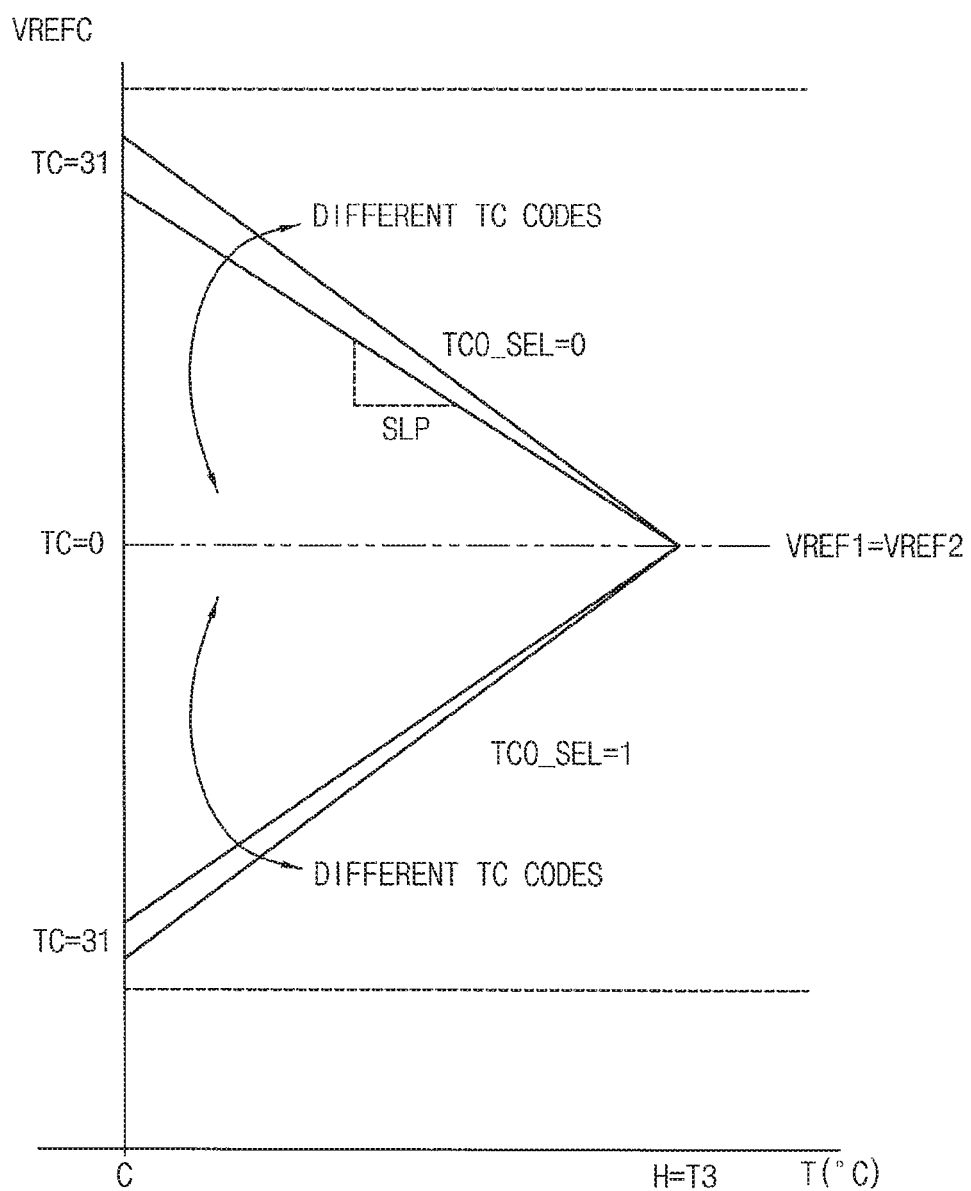
FIG. 12 illustrates a diagram of a variable reference voltage when a first variable reference voltage is equal to a second variable reference voltage.
Figure 13:
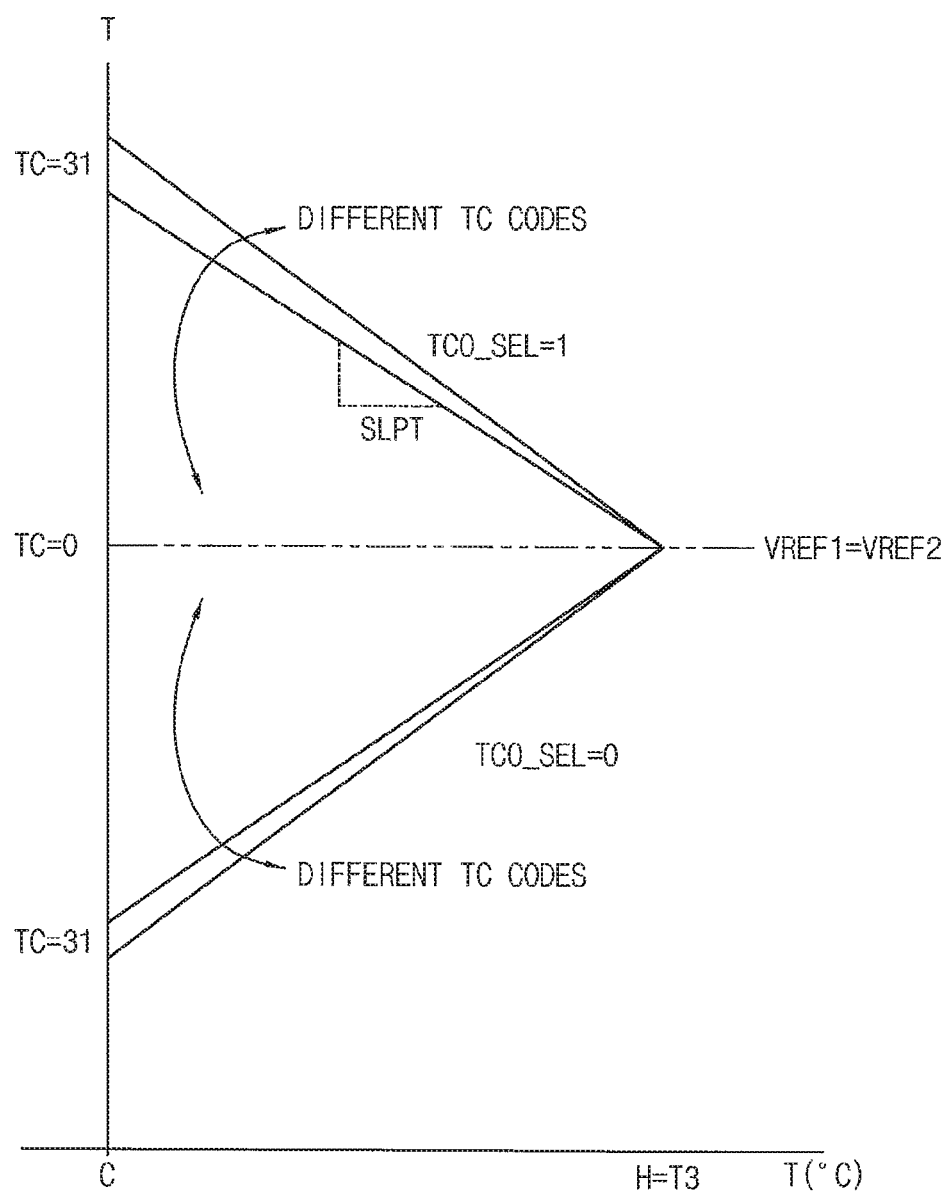
FIG. 13 illustrates a diagram of clock signal period when a first variable reference voltage is equal to a second variable reference voltage.

FIG. 12 illustrates a diagram of a variable reference voltage when a first variable reference voltage is equal to a second variable reference voltage, and FIG. 13 illustrates a diagram of clock signal period when a first variable reference voltage is equal to a second variable reference voltage.

Referring to FIGS. 12 and 13, the first fixed reference voltage VREF1 may be equal to the second fixed reference voltage VREF2. When the selection signal TCO_SEL is the first logic level, the variable reference voltage VREFC may be increased in proportion to variation of the temperature as the temperature is increased. In addition, when the selection signal TCO_SEL is the second logic level, the variable reference voltage VREFC may be decreased in proportion to variation of the temperature as the temperature is increased. The slope of the variable reference voltage VREFC may be decreased as the temperature coefficient TC is decreased. For example, when the temperature coefficient TC is 0, the slope of the variable reference voltage VREFC may be 0. When the first fixed reference voltage VREF1 is equal to the second fixed reference voltage VREF2, the variable reference voltage VREFC at the third temperature T3 when the selection signal TCO_SEL is the first logic level may be equal to the variable reference voltage VREFC at the third temperature T3 when the selection signal TCO_SEL is the second logic level.

When the selection signal TCO_SEL is the first logic level, a period of the clock signal CLK may be decreased as the temperature is increased. When the selection signal TCO_SEL is the second logic level, a period of the clock signal CLK may be increased as the temperature is increased. The period slope of the clock signal CLK may be decreased as the temperature coefficient TC is decreased. For example, when the temperature coefficient TC is 0, the period slope of the clock signal CLK may be 0. When the first fixed reference voltage VREF1 is equal to the second fixed reference voltage VREF2, the period of the clock signal CLK at the third temperature T3 when the selection signal TCO_SEL is the first logic level may be equal to the period of the clock signal CLK at the third temperature T3 when the selection signal TCO_SEL is the second logic level.

In the clock signal generation device 10, the path of providing the variable reference voltage VREFC to the clock signal generating circuit 500 may be separated from the path of providing the fixed reference voltage VREF to the clock signal generating circuit 500. When the path of providing the variable reference voltage VREFC to the clock signal generating circuit 500 is separated from the path of providing the fixed reference voltage VREF to the clock signal generating circuit 500, the variable reference voltage VREFC may be varied in proportion to variation of the temperature. In addition, when the path of providing the variable reference voltage VREFC to the clock signal generating circuit 500 is separated from the path of providing the fixed reference voltage VREF to the clock signal generating circuit 500, the period of the clock signal CLK may be varied in proportion to variation of the variable reference voltage VREFC. If the clock signal generation device 10 according to example embodiments is used, the linearity between the variation of the temperature and the period of the clock signal CLK may be increased, and a dependency of the period of the clock signal CLK on a power supply voltage VDD may be decreased.

The clock signal generation device 10 may increase performance by separating the path of providing the variable reference voltage VREFC to the clock signal generating circuit 500 from the path of providing the fixed reference voltage VREF to the clock signal generating circuit 500.

Figure 14:
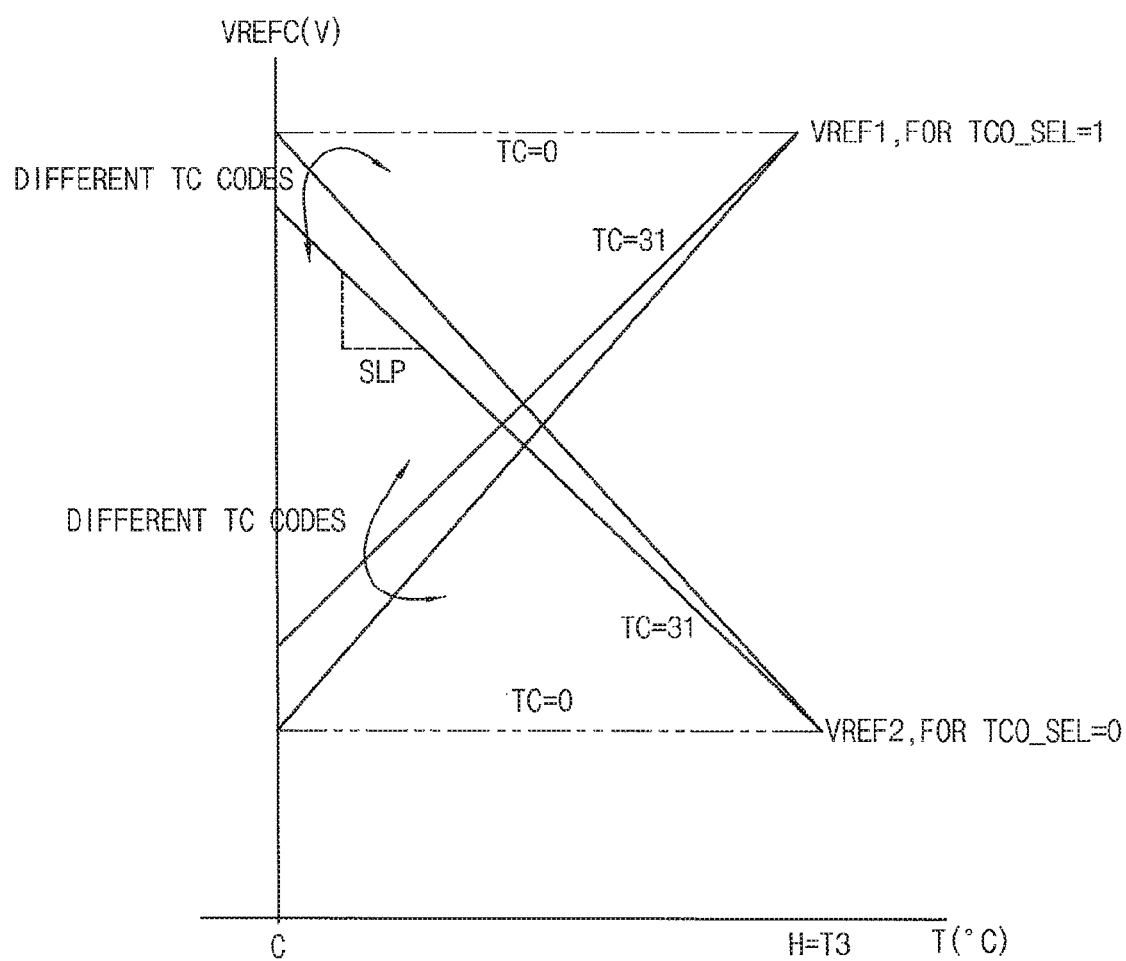
FIG. 14 illustrates a diagram of a variable reference voltage when a first variable reference voltage is greater than a second variable reference voltage.
Figure 15:
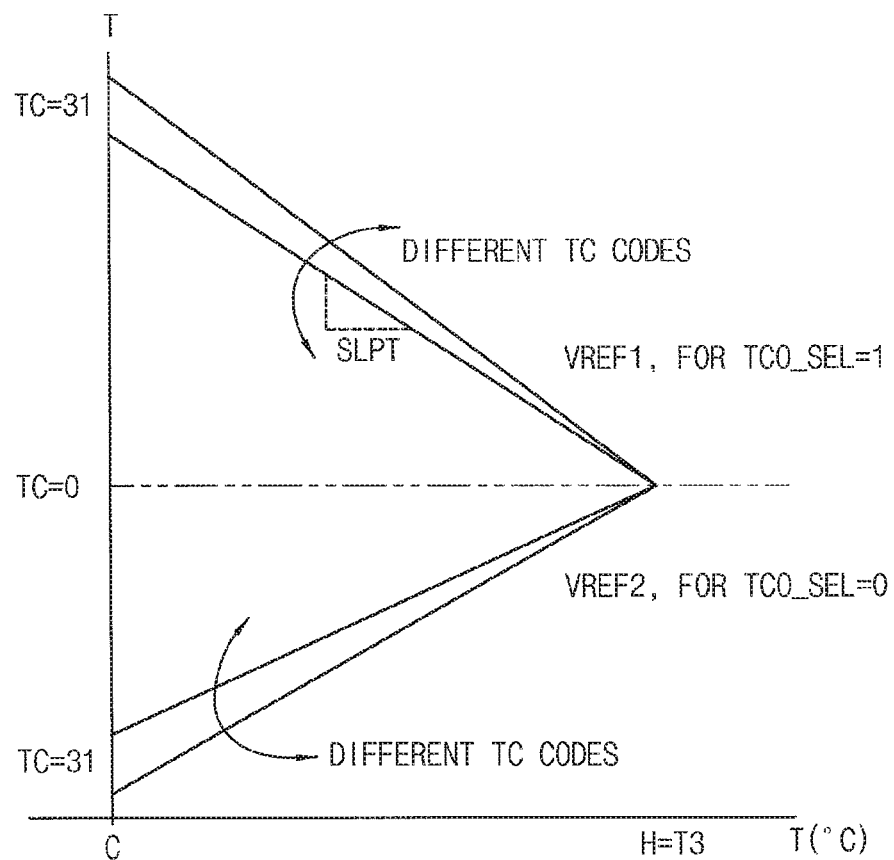
FIG. 15 illustrates a diagram of clock signal period when a first variable reference voltage is greater than a second variable reference voltage.

FIG. 14 illustrates a diagram of a variable reference voltage when a first variable reference voltage is greater than a second variable reference voltage and FIG. 15 illustrates a diagram of clock signal period when a first variable reference voltage is greater than a second variable reference voltage.

Referring to FIGS. 14 and 15, the first fixed reference voltage VREF1 may be greater than the second fixed reference voltage VREF2. When the selection signal TCO_SEL is the first logic level, the variable reference voltage VREFC may be increased in proportion to variation of the temperature as the temperature is increased. In addition, when the selection signal TCO_SEL is the second logic level, the variable reference voltage VREFC may be decreased in proportion to variation of the temperature as the temperature is increased. The slope of the variable reference voltage VREFC may be decreased as the temperature coefficient TC is decreased. For example, when the temperature coefficient TC is 0, the slope of the variable reference voltage VREFC may be 0. When the first fixed reference voltage VREF1 is greater than the second fixed reference voltage VREF2, the variable reference voltage VREFC at the third temperature T3 when the selection signal TCO_SEL is the first logic level may be different from the variable reference voltage VREFC at the third temperature T3 when the selection signal TCO_SEL is the second logic level. In this case, the fixed voltage providing circuit 300 may selectively provide the first fixed reference voltage VREF1 or the second fixed reference voltage VREF2 as the fixed reference voltage VREF based on the selection signal TCO_SEL.

When the selection signal TCO_SEL is the first logic level, a period of the clock signal CLK may be decreased as the temperature is increased. When the selection signal TCO_SEL is the second logic level, a period of the clock signal CLK may be increased as the temperature is increased. The period slope of the clock signal CLK may be decreased as the temperature coefficient TC is decreased. For example, when the temperature coefficient TC is 0, the period slope of the clock signal CLK may be 0.

When the fixed voltage providing circuit 300 selectively provides the first fixed reference voltage VREF1 or the second fixed reference voltage VREF2 as the fixed reference voltage VREF based on the selection signal TCO_SEL, the period of the clock signal CLK at the third temperature T3 when the selection signal TCO_SEL is the first logic level may be equal to the period of the clock signal CLK at the third temperature T3 when the selection signal TCO_SEL is the second logic level. In this case, a range of the period of the clock signal CLK may be increased.

Figure 16:
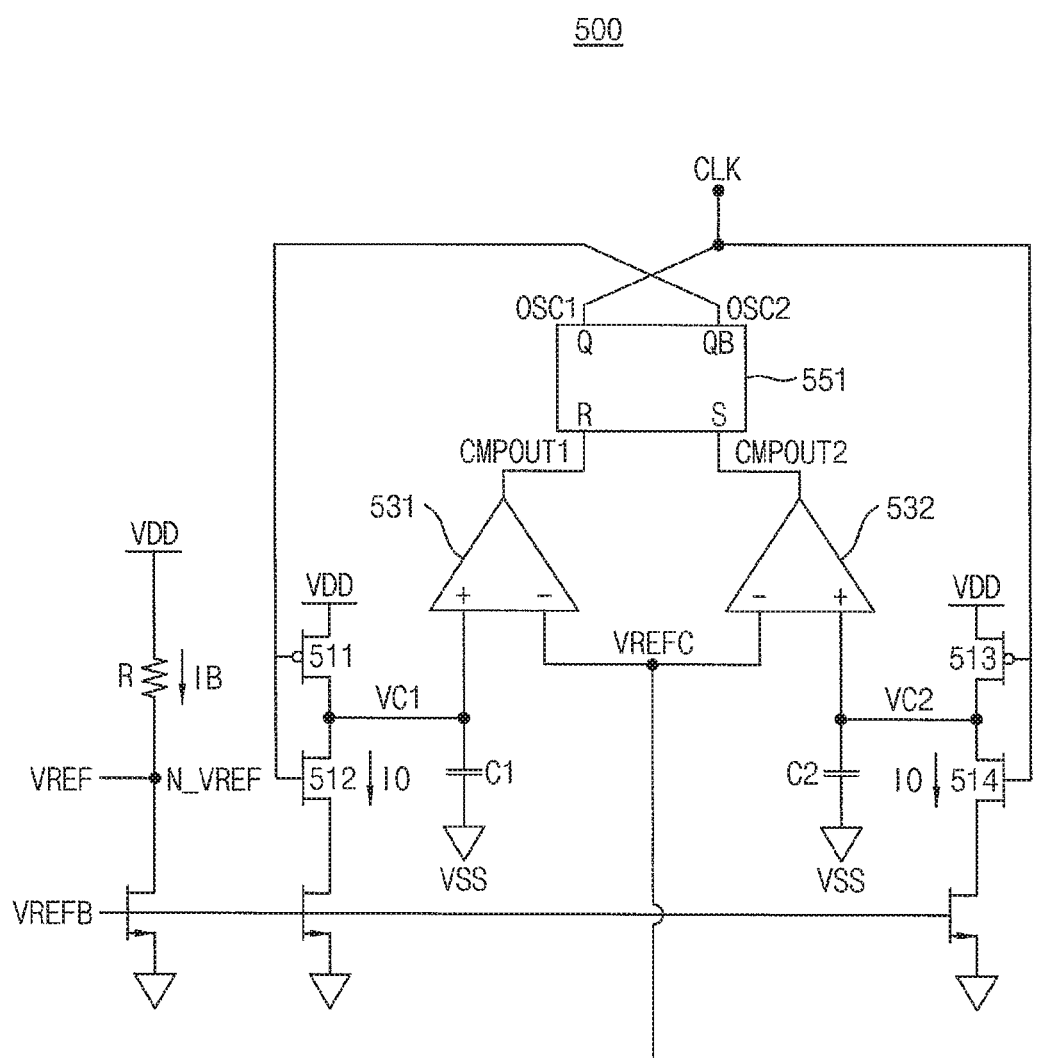
FIG. 16 illustrates a diagram of an example of a clock signal generating circuit included in the clock signal generation device of FIG. 1.
Figure 17:
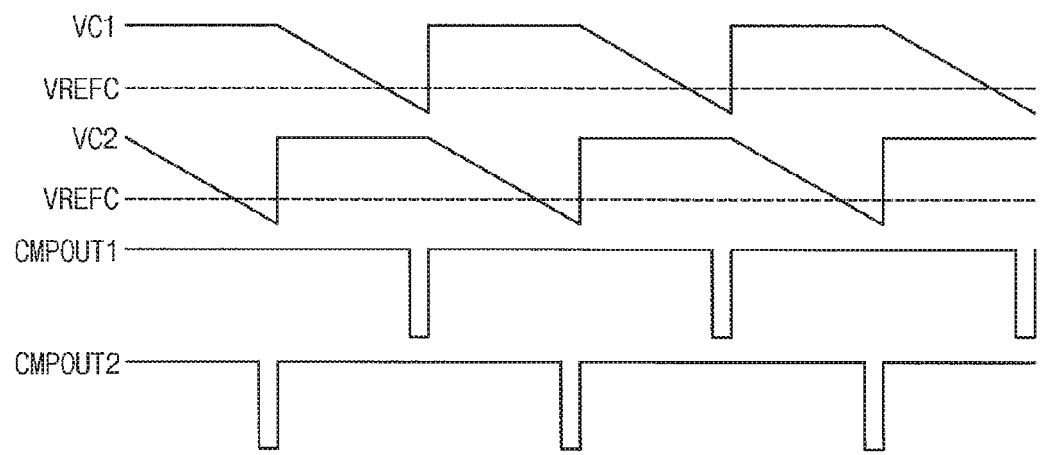
FIGS. 17 and 18 illustrate timing diagrams for describing an operation of the clock signal generating circuit of FIG. 16.
Figure 18:
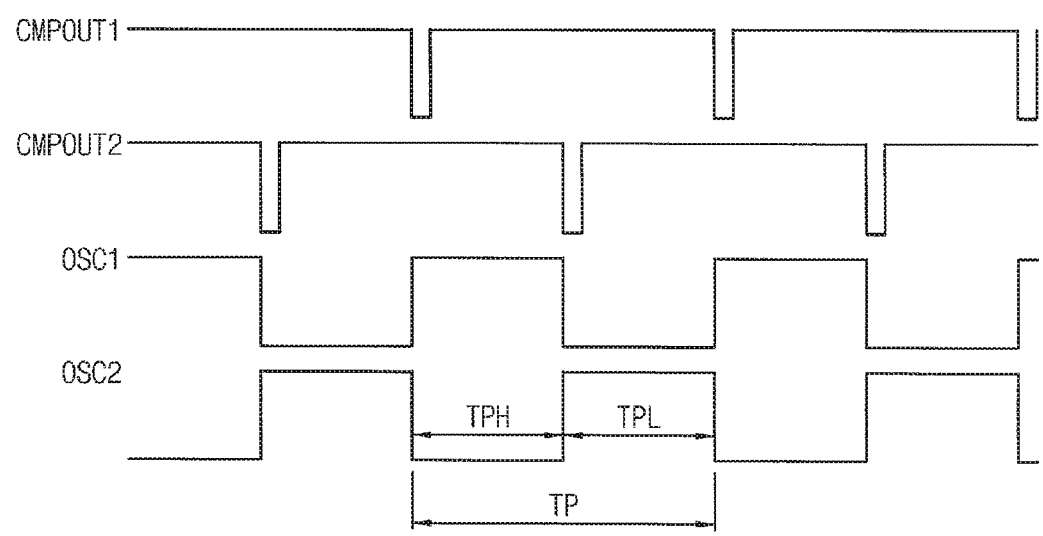

FIG. 16 illustrates a diagram of example of a clock signal generating circuit included in the clock signal generation device of FIG. 1, and FIGS. 17 and 18 illustrate timing diagrams for describing an operation of the clock signal generating circuit of FIG. 16.

Referring to FIGS. 16 to 18, the clock signal generating circuit 500 includes a plurality of transistors 511 to 514, a first capacitor C1, a second capacitor C2, a first comparator 531, a second comparator 532 and a latch 551. A first current IB may flow from the power supply voltage VDD to a fixed reference voltage node N_VREF through a resistor R. A second current IO may flow from the second transistor 512 to the ground voltage VSS, and flow from the fourth transistor 514 to the ground voltage VSS. The amplitude of the first current IB may be equal to the amplitude of the second current IO. In an example embodiment, the variable reference voltage VREFC may be provided to inputs of comparators 531 and 532 included in the clock signal generating circuit 500.

For example, the first oscillator signal OSC1 may be a logic high level. When the first oscillator signal OSC1 is the logic high level, the fourth transistor 514 is turned-on. When the fourth transistor 514 is turned-on, the second current IO may be transferred from the second capacitor C2 to the ground voltage VSS. When the second current IO is transferred from the second capacitor C2 to the ground voltage VSS, the second capacitor voltage VC2 may be decreased. When the second capacitor voltage VC2 is less than the variable reference voltage VREFC, the second comparator output CMPOUT2 may be the logic low level. In addition, the second oscillator signal OSC2 may be a logic low level. When the second oscillator signal OSC2 is the logic low level, the first transistor 511 is turned-on. When the first transistor 511 is turned-on, the power supply voltage VDD may be provided to the first capacitor C1. When the power supply voltage VDD is provided to the first capacitor C1, the first capacitor voltage VC1 may be greater than the variable reference voltage VREFC. When the first capacitor voltage VC1 is greater than the variable reference voltage VREFC, the first comparator output CMPOUT1 may be the logic high level. The latch 551 may provide the first oscillator signal OSC1 and the second oscillator signal OSC2 based on the first comparator output CMPOUT1 and the second comparator output CMPOUT2. The first oscillator signal OSC1 may be the clock signal CLK.

As illustrated in FIGS. 17 and 18, as a voltage level of the variable reference voltage VREFC increases according to the temperature, a time duration from a time at which the first capacitor voltage VC1 or the second capacitor voltage VC2 starts to decrease to a time at which the first capacitor voltage VC1 or the second capacitor voltage VC2 becomes equal to the variable reference voltage VREFC to transition the first comparator output CMPOUT1 or the second comparator output CMPOUT2 may decrease, such that a toggling period of the first oscillator signal OSC1 and the second oscillator signal OSC2 may decrease. Therefore, the period of the clock signal CLK, which corresponds to the first oscillator signal OSC1, may decrease.

Alternately, as a voltage level of the variable reference voltage VREFC decreases according to the temperature, a time duration from a time at which the first capacitor voltage VC1 or the second capacitor voltage VC2 starts to decrease to a time at which the first capacitor voltage VC1 or the second capacitor voltage VC2 becomes equal to the variable reference voltage VREFC to transition the first comparator output CMPOUT1 or the second comparator output CMPOUT2 may increase, such that a toggling period of the first oscillator signal OSC1 and the second oscillator signal OSC2 may increase. Therefore, the period of the clock signal CLK, which corresponds to the first oscillator signal OSC1, may increase.

Figure 19:
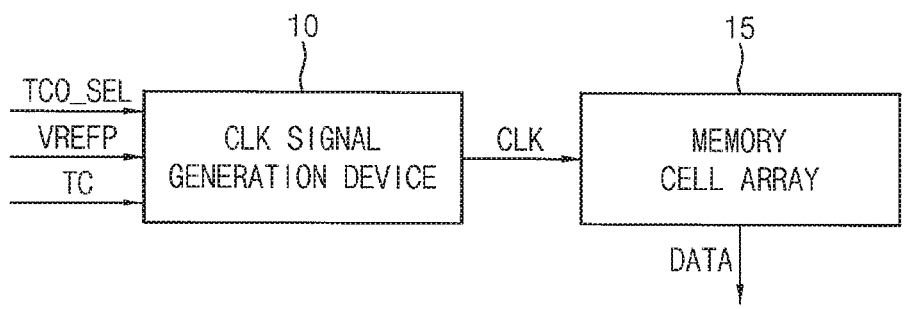
FIG. 19 illustrates a block diagram of a memory device according to an embodiment of the inventive concept.

FIG. 19 illustrates a block diagram of a memory device according to an embodiment of the inventive concept.

Referring to FIGS. 1 and 19, a memory device 20 includes a clock signal generation device 10 and a memory cell array 15. The clock signal generation device 10 provides a clock signal CLK based on a selection signal TCO_SEL, a reference voltage VREFP and a temperature coefficient TC. The memory cell array 15 operates based on the clock signal CLK. In some embodiments, the memory cell array 15 may be a three-dimensional memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679, 133; 8,553,466; 8,654,587; 8,559,235; and US Pat. Pub. No. 2011/0233648.

The clock signal generation device 10 includes a variable voltage providing circuit 100, a fixed voltage providing circuit 300 and a clock signal generating circuit 500, such as shown in FIG. 1. The variable voltage providing circuit 100 provides a variable reference voltage VREFC based on the selection signal TCO_SEL, the reference voltage VREFP and the temperature coefficient TC. The variable reference voltage VREFC is varied according to temperature. For example, the selection signal TCO_SEL may be one of a first logic level and a second logic level. The first logic level may be a logic high level and the second logic level may be a logic low level. The variable reference voltage VREFC may be varied based on the selection signal TCO_SEL. For example, when the selection signal TCO_SEL is the first logic level, the variable reference voltage VREFC may be increased as the temperature is increased. In addition, when the selection signal TCO_SEL is the second logic level, the variable reference voltage VREFC may be decreased as the temperature is increased.

The variable reference voltage VREFC may be varied based on the temperature coefficient TC. For example, a first temperature T1 may be less than a second temperature T2. When the temperature coefficient TC is 0, the variable reference voltage VREFC at the first temperature T1 may be equal to the variable reference voltage VREFC at the second temperature T2. As the temperature coefficient TC is increased, a difference between the variable reference voltage VREFC at the first temperature T1 and the variable reference voltage VREFC at the second temperature T2 may be increased.

The fixed voltage providing circuit 300 provides a fixed reference voltage VREF that is determined according to the selection signal TCO_SEL. The fixed reference voltage VREF is a constant voltage. For example, the fixed reference voltage VREF may include a first fixed reference voltage VREF1 and a second fixed reference voltage VREF2. When the selection signal TCO_SEL is the first logic level, the fixed voltage providing circuit 300 may provide the first fixed reference voltage VREF1. When the selection signal TCO_SEL is the second logic level, the fixed voltage providing circuit 300 may provide the second fixed reference voltage VREF2. The fixed reference voltage VREF is not varied according to the temperature.

The clock signal generating circuit 500 provides a clock signal CLK based on the fixed reference voltage VREF and the variable reference voltage VREFC. The variable reference voltage VREFC may be provided to comparators included in the clock signal generating circuit 500. In this case, the path of providing the variable reference voltage VREFC to the clock signal generating circuit 500 may be separated from the path of providing the fixed reference voltage VREF to the clock signal generating circuit 500. When the path of providing the variable reference voltage VREFC to the clock signal generating circuit 500 is separated from the path of providing the fixed reference voltage VREF to the clock signal generating circuit 500, the variable reference voltage VREFC may be varied in proportion to variation of the temperature. In addition, when the path of providing the variable reference voltage VREFC to the clock signal generating circuit 500 is separated from the path of providing the fixed reference voltage VREF to the clock signal generating circuit 500, the period of the clock signal CLK may be varied in proportion to variation of the variable reference voltage VREFC. If the clock signal generation device 10 according to example embodiments is used, the linearity between the variation of the temperature and the period of the clock signal CLK may be increased, and a dependency of the period of the clock signal CLK on a power supply voltage VDD may be decreased.

The clock signal generation device 10 may increase performance by separating the path of providing the variable reference voltage VREFC to the clock signal generating circuit 500 from the path of providing the fixed reference voltage VREF to the clock signal generating circuit 500.

Figure 20:
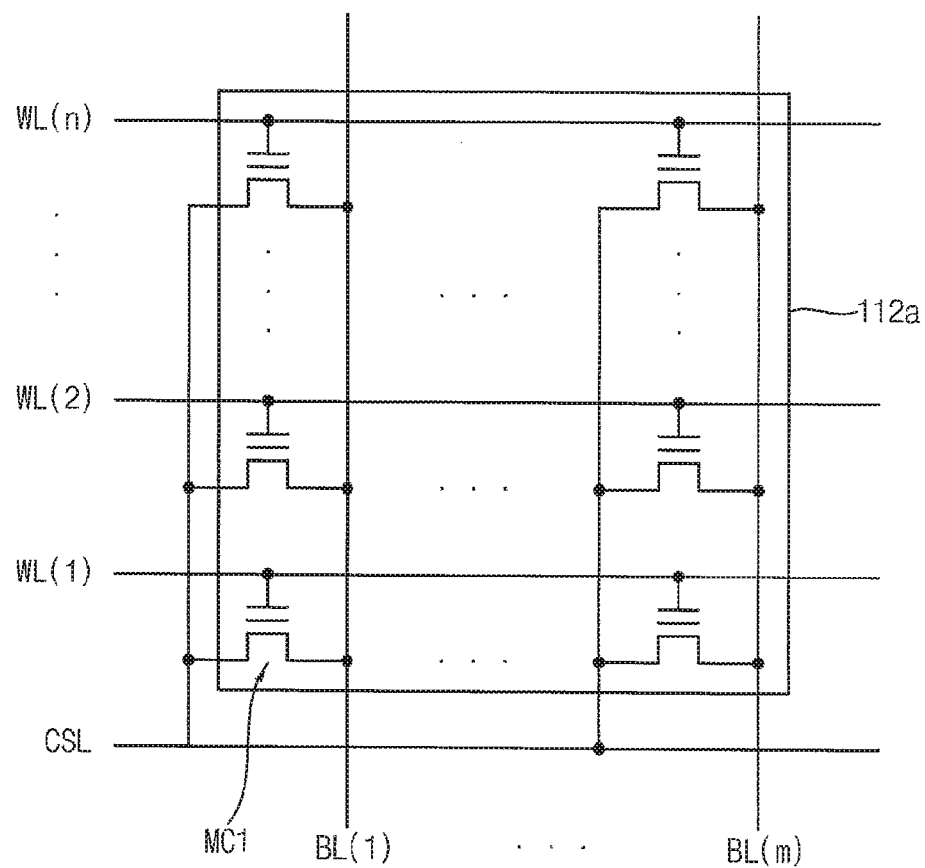
FIG. 20 illustrates a diagram of an example of a memory cell array included in the memory device of FIG. 19.
Figure 21:
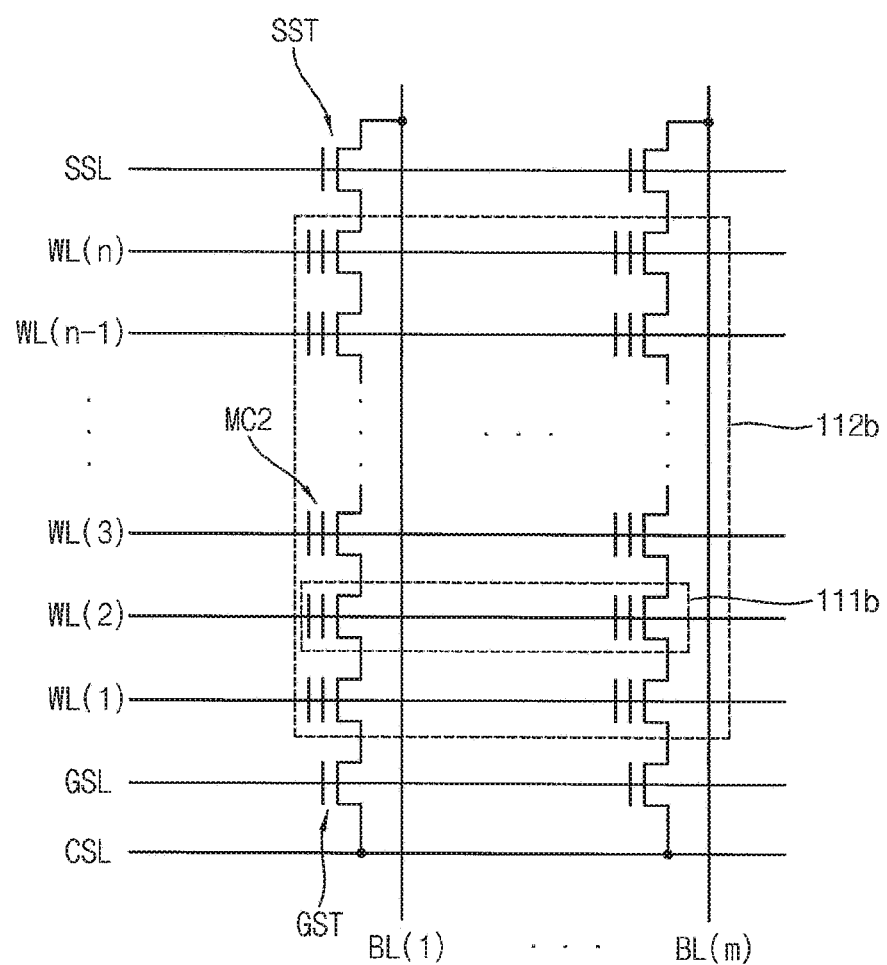
FIG. 21 illustrates a diagram of another example of a memory cell array included in the memory device of FIG. 19.
Figure 22:
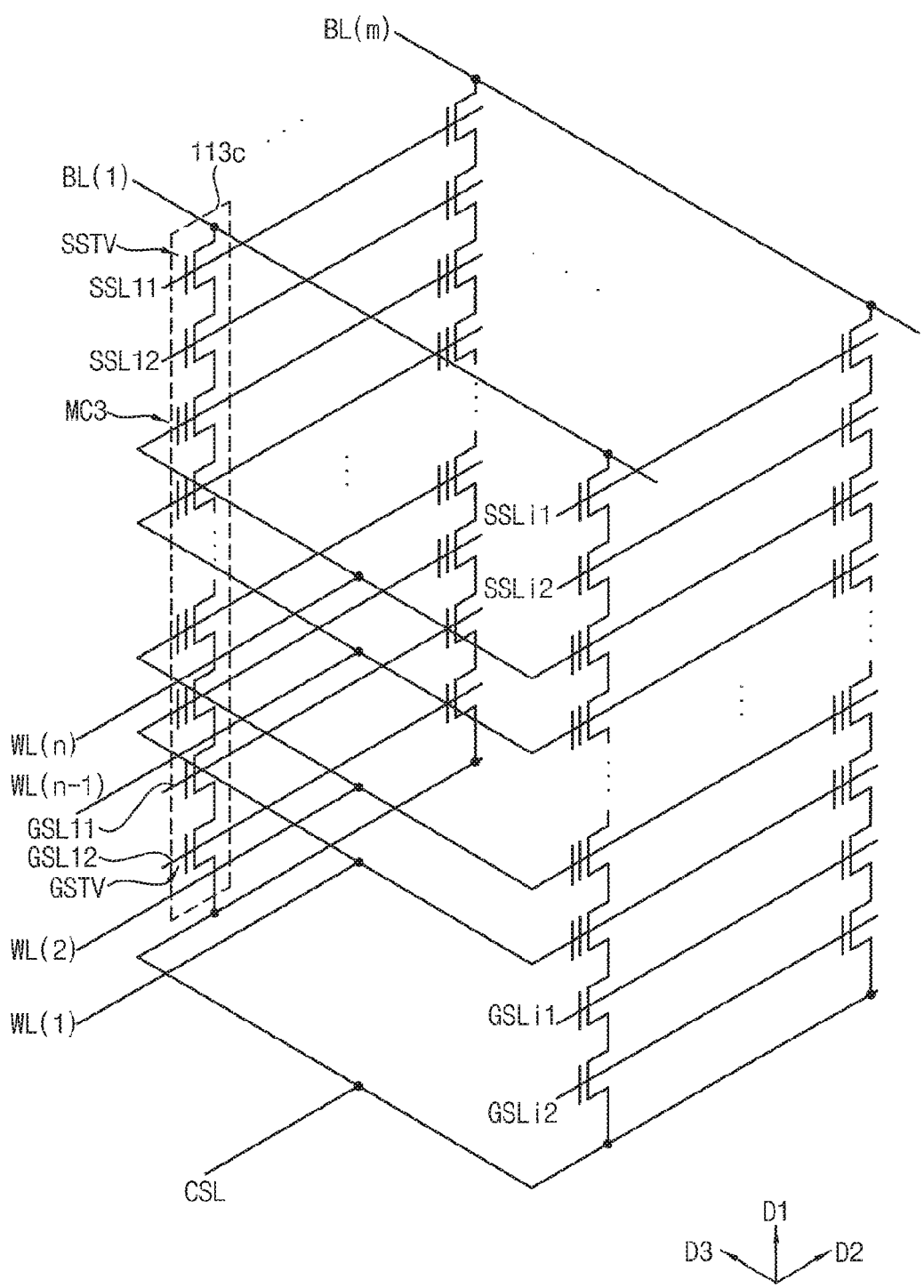
FIG. 22 illustrates a diagram of still another example of a memory cell array included in the memory device of FIG. 19.

FIG. 20 illustrates a diagram of an example of a memory cell array included in the memory device of FIG. 19, FIG. 21 illustrates a diagram of another example of a memory cell array included in the memory device of FIG. 19, and FIG. 22 illustrates a diagram of still another example of a memory cell array included in the memory device of FIG. 19.

Referring to FIG. 20, memory cell array 110a may include multiple memory cells MC1. Memory cells MC1 located in the same row may be disposed in parallel between one of bit lines BL(1), . . . , BL(m) and a common source line CSL and may be connected in common to one of word lines WL(1), WL(2), . . . , WL(n)). For example, memory cells located in the first row may be disposed in parallel between the first bit line WL(1) and common source line CSL. The gate electrodes of the memory cells disposed in the first row may be connected in common to first word line WL(1). Memory cells MC1 may be controlled according to a level of a voltage applied to word lines WL(1), . . . , WL(n). The NOR flash memory device comprising memory cell array 110a may perform the write and read operations in units of byte or words, and may perform the erase operation in units of block such as block 112a as shown.

Referring to FIG. 21, memory cell array 110b comprises string selection transistors SST, ground selection transistors GST and memory cells MC2. String selection transistors SST are connected to bit lines BL(1), . . . , BL(m), and ground selection transistors GST are connected to common source line CSL. Memory cells MC2 disposed in the same row are disposed in series between one of bit lines BL(1), . . . , BL(m) and common source line CSL, and memory cells MCs disposed in the same column are connected in common to one of word lines WL(1), WL(2), WL(3), . . . , WL(n–1), WL(n). That is, memory cells MC2 are connected in series between string selection transistors SST and ground selection transistors GST, and word lines of 16, 32, or 64 in number may be disposed between string selection line SSL and ground selection line GSL.

String selection transistors SST are connected to string selection line SSL such that string selection transistors SST may be controlled according to a level of the voltage applied from string selection line SSL thereto. Memory cells MC2 may be controlled according to a level of a voltage applied to word lines WL(1), . . . , WL(n).

The NAND flash memory device comprising memory cell array 110b performs write and read operations in units of page 111b, and it performs erase operations in units of block 112b. Meanwhile, according to some embodiments, each of the page buffers may be connected to even and odd bit lines one by one. In this case, the even bit lines form an even page, the odd bit lines form an odd page, and the even and odd pages may be accessed in turn to sequentially perform the write operation into memory cells MC2.

Referring to FIG. 22, memory cell array 110c comprises multiple strings 113c having a vertical structure. Strings 113c are formed in the second direction D2 to form a string row. Multiple string rows are formed in the third row to form a string array. Each of strings 113c comprises ground selection transistors GSTV, memory cells MC3, and string selection transistors SSTV, which are disposed in series in the first direction D1 between bit lines BL(1), . . . , BL(m) and common source line CSL.

Ground selection transistors GSTV are connected to ground selection lines GSL11, GSL12, . . . , GSLi1, GSLi2, respectively, and string selection transistors SSTV are connected to string selection lines SSL11, SSL12, . . . , SSLi1, SSLi2, respectively. Memory cells MC3 disposed in the same layer are connected in common to one of word lines WL(1), WL(2), . . . , WL(n–1), WL(n). Ground selection lines GSL11, . . . , GSLi2 and string selection lines SSL11, . . . , SSLi2 extend in the second direction and are formed along the third direction D3. Word lines WL(1), . . . , WL(n) extend in the second direction and are formed along the first and third directions. Bit lines BL(1), . . . , BL(m) extend in the third direction and are formed along the second direction. Memory cells MC3 are controlled according to a level of a voltage applied to word lines WL(1), . . . , WL(n).

Because the vertical flash memory device comprising memory cell array 110c comprises NAND flash memory cells, like the NAND flash memory device, the vertical flash memory device performs the write and read operations in units of pages and the erase operation in units of block. In some embodiments, two string selection transistors in one string 113c are connected to one string selection line, and two ground selection transistors in one string are connected to one ground selection line. Further, according to some embodiments, one string comprises one string selection transistor and one ground selection transistor.

In an example embodiment, the memory cell array may be a three-dimensional memory array. In addition, in an embodiment of the present disclosure, a three dimensional (3D) memory array is provided in the memory device 20. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 23:
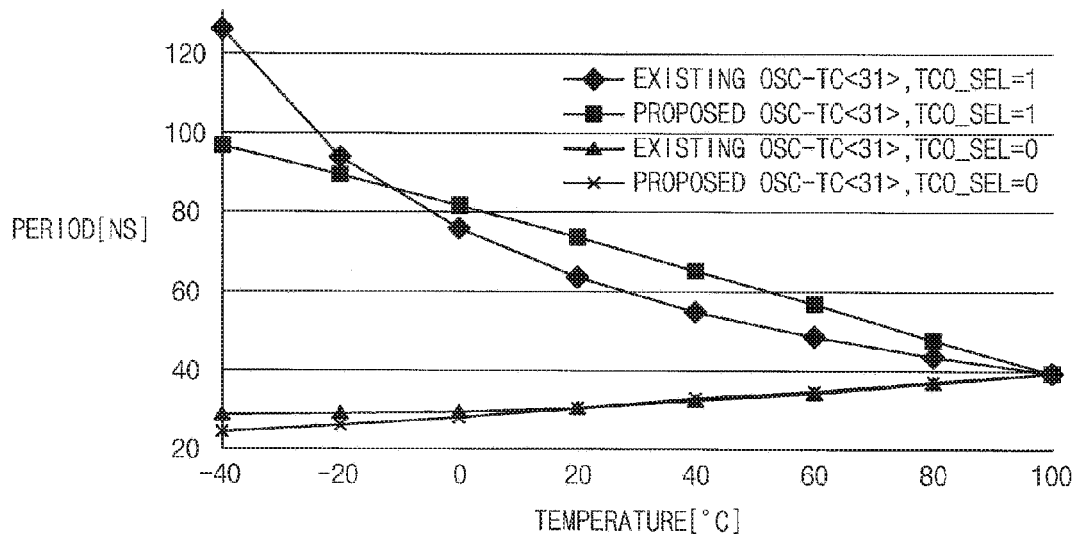
FIG. 23 illustrates a diagram of an experimental result for a clock signal period that is varied according to temperature.

FIG. 23 illustrates a diagram of an experimental result for a clock signal period that is varied according to temperature.

Referring to FIG. 23, in a conventional clock signal generation device, the period of the clock signal is not linearly varied. For example, while the temperature is changed from –40 degrees to –20 degrees, the period of the clock signal is changed from 125 ns to 97 ns (as shown by the curve indicated with diamond shapes). In addition, while the temperature is changed from –20 degrees to 0 degrees, the period of the clock signal is changed from 97 ns to 78 ns. In this case, while the temperature is changed from –40 degrees to –20 degrees, the period of the clock signal is changed by 28 ns. While the temperature is changed from –20 degrees to 0 degrees, the period of the clock signal is changed by 19 ns. Therefore, in a conventional clock signal generation device, the period of the clock signal is not linearly varied.

In the clock signal generation device 10 according to example embodiments of the inventive concept, the period of the clock signal CLK may be linearly varied. For example, while the temperature is changed from –40 degrees to –20 degrees, the period of the clock signal CLK may be changed from 98 ns to 89 ns (as shown by the curve indicated with square shapes). In addition, while the temperature is changed from –20 degrees to 0 degrees, the period of the clock signal CLK may be changed from 89 ns to 80 ns. In this case, while the temperature is changed from –40 degrees to –20 degrees, the period of the clock signal CLK may be changed by 9 ns. While the temperature is changed from –20 degrees to 0 degrees, the period of the clock signal CLK may be changed by 9 ns. Therefore, in the clock signal generation device 10 according to example embodiments of the inventive concept, the period of the clock signal CLK may be linearly varied. This may also be appreciated in view of the curves indicated with triangle shapes and x shapes, which respectively show clock periods in a conventional clock signal generation device and in the clock signal generation device 10 according to example embodiments of the inventive concept.

Figure 24:
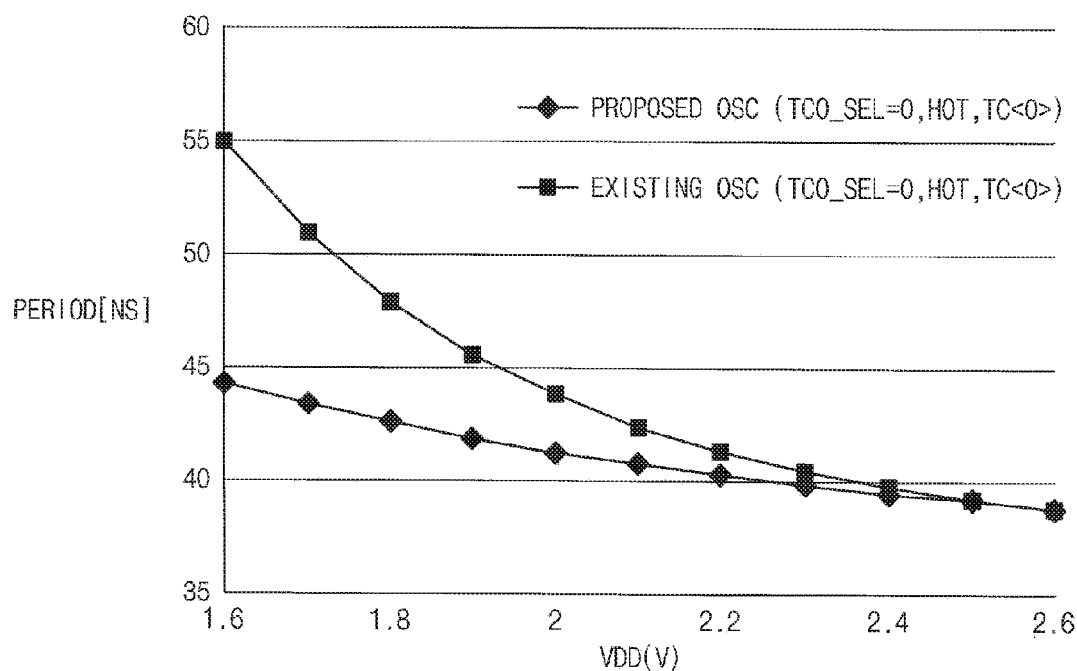
FIG. 24 illustrates a diagram of an experimental result for a clock signal period that is varied according to a power supply voltage when a temperature coefficient is 0.
Figure 25:
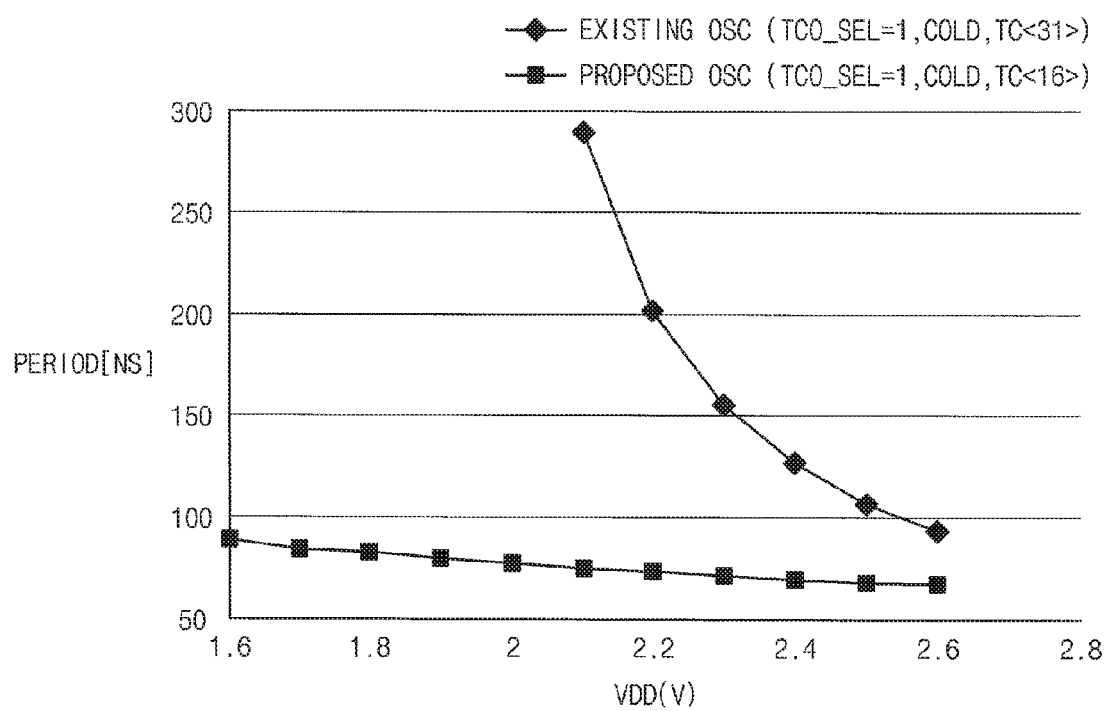
FIG. 25 illustrates a diagram of an experimental result for a clock signal period that is varied according to a power supply voltage when a temperature coefficient is a constant.

FIG. 24 illustrates a diagram of an experimental result for a clock signal period that is varied according to a power supply voltage when a temperature coefficient is 0, and FIG. 25 illustrates a diagram of an experimental result for a clock signal period that is varied according to a power supply voltage when a temperature coefficient is a constant.

Referring to FIG. 24, the temperature coefficient TC used in FIG. 24 may be 0. When the power supply voltage VDD in the conventional clock signal generation device is 1.6V, the period of the clock signal may be 55 ns (as shown by the curve indicated with square shapes). When the power supply voltage VDD in the conventional clock signal generation device is 2V, the period of the clock signal may be 44 ns. In this case, while the power supply voltage VDD is changed from 1.6V to 2V, the period of the clock signal may be changed by 11ns.

When the power supply voltage VDD in the clock signal generation device 10 according to example embodiments of the inventive concept is 1.6V, the period of the clock signal CLK may be 44 ns (as shown by the curve indicated with diamond shapes). When the power supply voltage VDD in the clock signal generation device 10 according to example embodiments is 2V, the period of the clock signal CLK may be 42 ns. In this case, while the power supply voltage VDD is changed from 1.6V to 2V, the period of the clock signal CLK may be changed by 2 ns.

The variation of the period of the clock signal CLK according to the power supply voltage VDD in the clock signal generation device 10 according to example embodiments of the inventive concept may be less than the variation of the period of the clock signal according to the power supply voltage VDD in the conventional clock signal generation device.

Referring to FIG. 25, the temperature coefficient TC used in FIG. 25 is not 0. When the power supply voltage VDD in the conventional clock signal generation device is 2.2V, the period of the clock signal may be 200 ns (as shown by the curve indicated with diamond shapes). When the power supply voltage VDD in the conventional clock signal generation device is 2.4V, the period of the clock signal CLK may be 128 ns. In this case, while the power supply voltage VDD is changed from 2.2V to 2.4V, the period of the clock signal CLK may be changed by 72 ns.

When the power supply voltage VDD in the clock signal generation device 10 according to example embodiments of the inventive concept is 2.2V, the period of the clock signal CLK may be 75 ns (as shown by the curve indicated with square shapes). When the power supply voltage VDD in the clock signal generation device 10 according to example embodiments is 2.4V, the period of the clock signal CLK may be 72 ns. In this case, while the power supply voltage VDD is changed from 2.2V to 2.4V, the period of the clock signal CLK may be changed by 3 ns.

The variation of the period of the clock signal CLK according to the power supply voltage VDD in the clock signal generation device 10 according to example embodiments of the inventive concept may be less than the variation of the period of the clock signal according to the power supply voltage VDD in the conventional clock signal generation device. In addition, the variation of the period of the clock signal according to the power supply voltage VDD in the conventional clock signal generation device may be increased as the temperature coefficient TC is increased.

In the clock signal generation device 10, the path of providing the variable reference voltage VREFC to the clock signal generating circuit 500 may be separated from the path of providing the fixed reference voltage VREF to the clock signal generating circuit 500. When the path of providing the variable reference voltage VREFC to the clock signal generating circuit 500 is separated from the path of providing the fixed reference voltage VREF to the clock signal generating circuit 500, the variable reference voltage VREFC may be varied in proportion to variation of the temperature. In addition, when the path of providing the variable reference voltage VREFC to the clock signal generating circuit 500 is separated from the path of providing the fixed reference voltage VREF to the clock signal generating circuit 500, the period of the clock signal CLK may be varied in proportion to variation of the variable reference voltage VREFC. If the clock signal generation device 10 according to example embodiments is used, the linearity between the variation of the temperature and the period of the clock signal CLK may be increased, and a dependency of the period of the clock signal CLK on a power supply voltage VDD may be decreased.

The clock signal generation device 10 may increase performance by separating the path of providing the variable reference voltage VREFC to the clock signal generating circuit 500 from the path of providing the fixed reference voltage VREF to the clock signal generating circuit 500.

Figure 26:
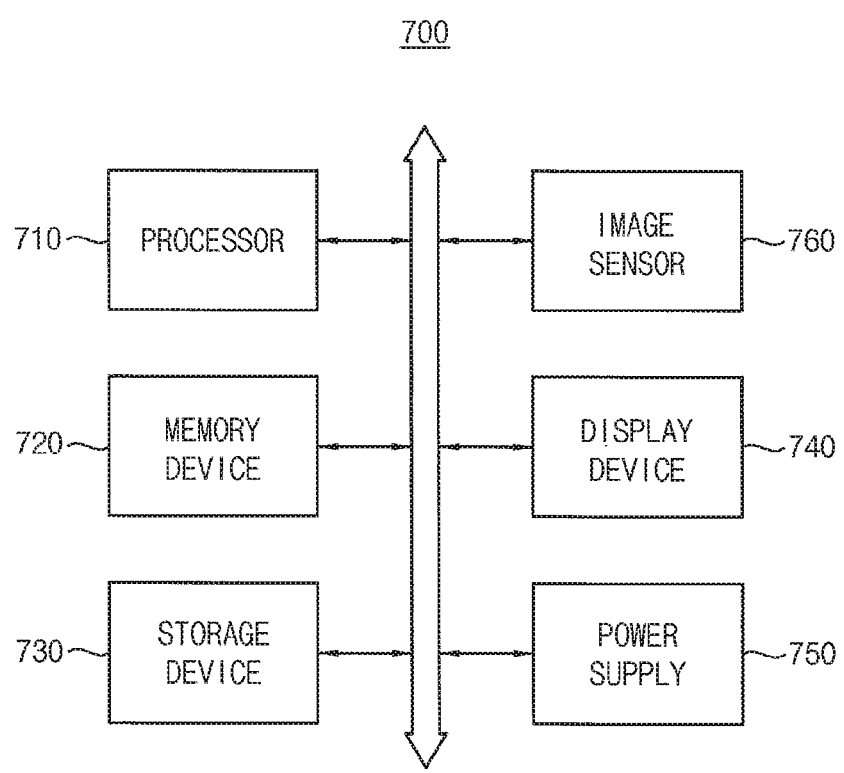
FIG. 26 illustrates a block diagram of a mobile device including the memory module according to embodiments of the inventive concept.

FIG. 26 illustrates a block diagram of a mobile device including the memory module according to embodiments of the inventive concept.

Referring to FIG. 26, a mobile device 700 includes a processor 710, a memory device 720, a storage device 730, a display device 740, a power supply 750 and an image sensor 760. The mobile device 700 may further include ports that communicate with a video card, a sound card, a memory card, a USB device, other electronic devices, or the like.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may store data for operating the mobile device 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes the data loading circuit according to example embodiments. The storage device 730 may include a solid state drive (SSD), a hard disk drive (HDD), a CD-ROM, etc. The mobile device 700 may further include an input device such as a touch screen, a keyboard, a keypad, a mouse, or the like, and an output device such as a printer, a display device, or the like. The power supply 750 supplies operation voltages for the mobile device 700.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the mobile device 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The mobile device 700 may be a digital camera, a mobile phone, a smart phone, a portable multimedia player (PMP), a personal digital assistant (PDA), a computer, or the like.

Figure 27:
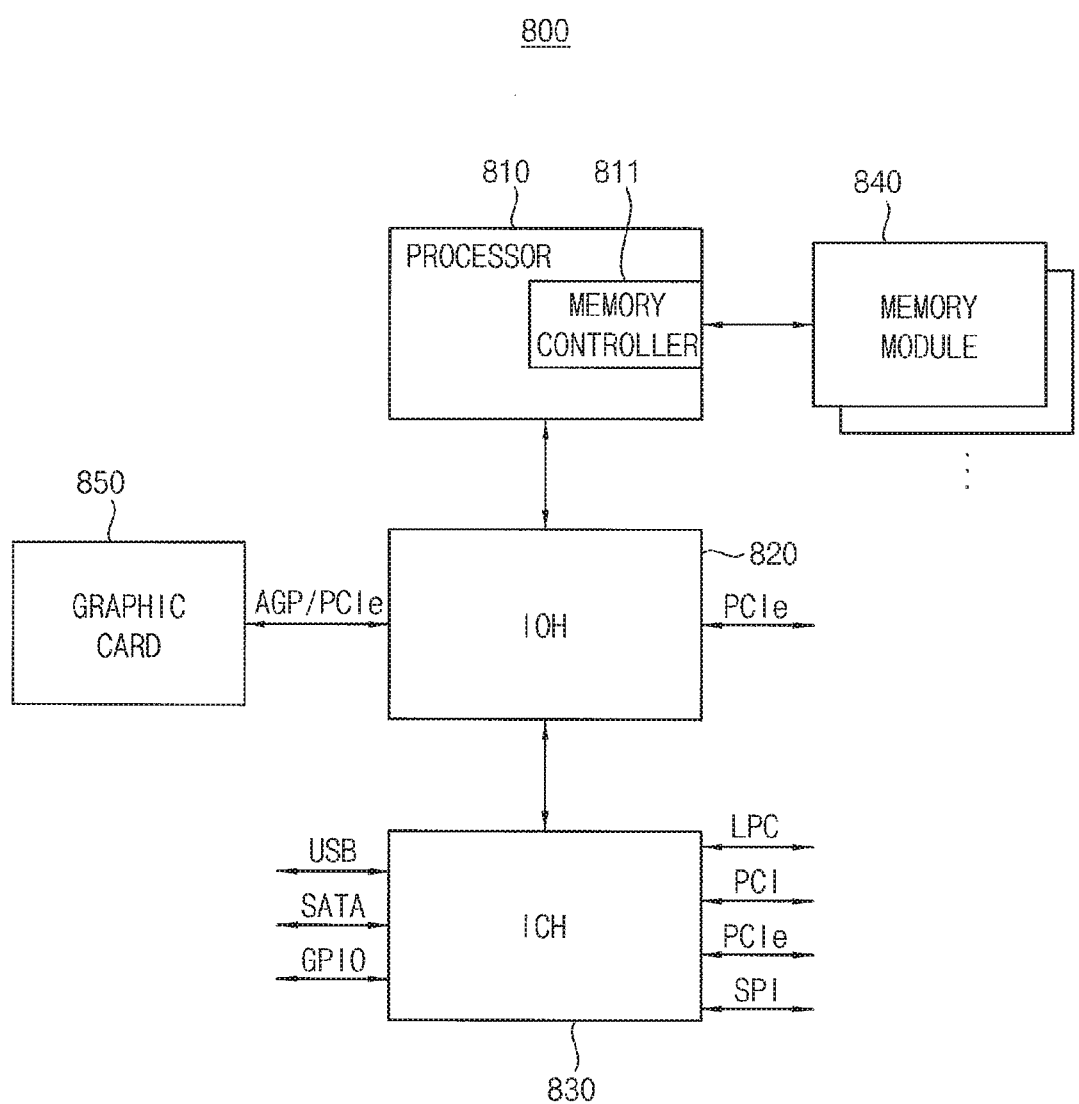
FIG. 27 illustrates a block diagram of a computing system including the memory module according to embodiments of the inventive concept.

FIG. 27 illustrates a block diagram of a computing system including the memory system according to embodiments of the inventive concept.

Referring to FIG. 27, a computing system 800 includes a processor 810, an input/output hub (IOH) 820, an input/output controller hub (ICH) 830, at least one memory module 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, or the like.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, or the like. In some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a Quick-Path interconnect (QPI), a common system interface (CSI), or the like. In some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, or the like.

The graphics card 850 may be coupled to the input/output hub 820 via AGP or PCIe. The graphics card 850 may control a display device (not shown) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, or the like. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, or the like.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

The present inventive concept may be applied to systems such as a mobile phone, a smart phone, a personal digital assistant (PDA), a portable multimedia player (PMP), a digital camera, a music player, a portable game console, a navigation system, or the like.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

The foregoing is illustrative of exemplary embodiments and is not to be construed as limiting thereof. Although a few embodiments have been described, those skilled in the art will readily appreciate that many modifications are possible in the embodiments without materially departing from the novel teachings and advantages of embodiments of the inventive concepts. Accordingly, all such modifications are intended to be included within the scope of the inventive concepts as defined in the claims. Therefore, it is to be understood that the foregoing is illustrative of various exemplary embodiments and is not to be construed as limited to the specific embodiments disclosed, and that modifications to the disclosed embodiments, as well as other embodiments, are intended to be included within the scope of the appended claims.

What is claimed is:
1. A clock signal generation device comprising:
a variable voltage providing circuit configured to provide a variable reference voltage based on a selection signal, a reference voltage and a temperature coefficient, the variable reference voltage being varied according to temperature;

a fixed voltage providing circuit configured to provide a fixed reference voltage that is determined according to the selection signal, the fixed reference voltage being a constant voltage; and a clock signal generating circuit configured to provide a clock signal based on the fixed reference voltage and the variable reference voltage.

2. The clock signal generation device of claim 1, wherein the variable voltage providing circuit comprises:

a voltage provider configured to provide a temperature-variable voltage and a temperature-fixed voltage, the temperature-variable voltage being varied according to the temperature, and the temperature-fixed voltage being fixed according to the temperature; and a voltage regulator configured to provide the variable reference voltage based on the temperature-variable voltage, the temperature-fixed voltage, the reference voltage, the temperature coefficient and the selection signal.

3. The clock signal generation device of claim 2, wherein the voltage regulator comprises:

a differential difference amplifier configured to provide an amplification output voltage based on the temperature-variable voltage, the temperature-fixed voltage, the reference voltage, the temperature coefficient and a feedback voltage; and a voltage output circuit configured to provide the variable reference voltage and the feedback voltage based on the amplification output voltage and the selection signal.

4. The clock signal generation device of claim 3, wherein the variable voltage providing circuit further comprises a selector configured to select the temperature-variable voltage and the temperature-fixed voltage based on the selection signal.

5. The clock signal generation device of claim 4, wherein when the selection signal is a first logic level, the selector is configured to provide the temperature-variable voltage to a second input of the differential difference amplifier and provide the temperature-fixed voltage to a first input of the differential difference amplifier.

6. The clock signal generation device of claim 5, wherein when the selection signal is the first logic level, the variable reference voltage is increased in proportion to variation of the temperature as the temperature is increased, and wherein when the selection signal is the first logic level and the variable reference voltage is increased, a period of the clock signal is decreased in proportion to variation of the variable reference voltage.

7. The clock signal generation device of claim 4, wherein when the selection signal is a second logic level, the selector is configured to provide the temperature-variable voltage to a first input of the differential difference amplifier and provide the temperature-fixed voltage to a second input of the differential difference amplifier.

8. The clock signal generation device of claim 7, wherein when the selection signal is the second logic level, the variable reference voltage is decreased in proportion to variation of the temperature as the temperature is increased, and wherein when the selection signal is the second logic level and the variable reference voltage is decreased, a period of the clock signal is increased in proportion to variation of the variable reference voltage.

9. The clock signal generation device of claim 4, wherein the reference voltage is provided to a third input of the differential difference amplifier and the feedback voltage is provided to a fourth input of the differential difference amplifier, and wherein the reference voltage is provided from the fixed voltage providing circuit.

10. The clock signal generation device of claim 3, wherein the voltage output circuit comprises:

a transistor connected between a variable reference voltage node and a power supply voltage, the variable reference voltage being output at the variable reference voltage node;

a first voltage output resistor connected between the variable reference voltage node and a feedback voltage node, the feedback voltage being output at the feedback voltage node; and a second voltage output resistor connected between the feedback voltage node and a ground voltage, wherein the first voltage output resistor is configured to vary a resistance of the first voltage output resistor based on the selection signal.

11. The clock signal generation device of claim 1, wherein the fixed voltage providing circuit comprises a resistor circuit in which a first reference resistor, a second reference resistor and a third reference resistor are serially connected between a power supply voltage and a ground voltage, wherein the fixed reference voltage includes a first fixed reference voltage and a second fixed reference voltage, wherein the first fixed reference voltage is provided from a first fixed reference voltage node that connects the first reference resistor and the second reference resistor, and wherein the second fixed reference voltage is provided from a second fixed reference voltage node that connects the second reference resistor and the third reference resistor.

12. The clock signal generation device of claim 11, wherein when the selection signal is a first logic level, the fixed reference voltage is the first fixed reference voltage, and wherein when the selection signal is a second logic level, the fixed reference voltage is the second fixed reference voltage.

13. The clock signal generation device of claim 1, wherein the variable reference voltage is provided to inputs of comparators included in the clock signal generating circuit.

14. A memory device comprising:

a clock signal generation device configured to provide a clock signal based on a selection signal, a reference voltage and a temperature coefficient; and a memory cell array configured to operate based on the clock signal, the clock signal generation device comprising a variable voltage providing circuit configured to provide a variable reference voltage based on the selection signal, the reference voltage and the temperature coefficient, the variable reference voltage being varied according to temperature, a fixed voltage providing circuit configured to provide a fixed reference voltage that is determined according to the selection signal, the fixed reference voltage being a constant voltage, and a clock signal generating circuit configured to provide the clock signal based on the fixed reference voltage and the variable reference voltage.

15. The memory device of claim 14, wherein the memory cell array is a three-dimensional memory cell array.

16. A clock signal generation device comprising:
- a variable voltage providing circuit configured to provide a variable reference voltage based on a selection signal, the variable reference voltage being varied according to temperature;
- a fixed voltage providing circuit configured to provide a fixed reference voltage that is determined according to the selection signal, the fixed reference voltage being a constant voltage; and
- a clock signal generating circuit configured to provide a clock signal based on the fixed reference voltage and the variable reference voltage,
- wherein the variable voltage providing circuit is configured to increase the variable reference voltage in proportion to variation of the temperature as the temperature is increased when the selection signal is a first logic level, and to decrease the variable reference voltage in proportion to variation of the temperature as the temperature is increased when the selection signal is a second logic level.

17. The clock signal generation device of claim 16, wherein the clock signal generating circuit is configured to decrease a period of the clock signal in proportion to variation of the variable reference voltage, when the selection signal is the first logic level and the variable reference voltage is increased.

18. The clock signal generation device of claim 16, wherein the clock signal generating circuit is configured to increase a period of the clock signal in proportion to variation of the variable reference voltage, when the selection signal is the second logic level and the variable reference voltage is decreased.

19. The clock signal generation device of claim 16, wherein the variable voltage providing circuit comprises:
- a voltage provider configured to provide a temperature-variable voltage and a temperature-fixed voltage, the temperature-variable voltage being varied according to the temperature, and the temperature-fixed voltage being fixed according to the temperature; and
- a voltage regulator configured to provide the variable reference voltage based on the temperature-variable voltage, the temperature-fixed voltage, a reference voltage, a temperature coefficient and the selection signal.

20. The clock signal generation device of claim 16, wherein the variable voltage providing circuit is configured to increase and decrease the variable reference voltage linearly.

* * * * *